United States Patent
Scheller et al.

(10) Patent No.: US 6,242,908 B1
(45) Date of Patent: *Jun. 5, 2001

(54) DETECTION OF PASSING MAGNETIC ARTICLES WHILE ADAPTING THE DETECTION THRESHOLD

(75) Inventors: P. Karl Scheller, Rochester; Glenn A. Forrest, Nottingham, both of NH (US)

(73) Assignee: Allegro Microsystems, Inc., Worcester, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/275,209

(22) Filed: Mar. 24, 1999

Related U.S. Application Data

(63) Continuation-in-part of application No. 08/847,703, filed on Apr. 28, 1997, now Pat. No. 5,917,320, which is a continuation-in-part of application No. 08/587,407, filed on Jan. 17, 1996, now Pat. No. 5,650,719.

(51) Int. Cl.[7] .............................. G01P 3/48; G01P 3/489
(52) U.S. Cl. .................... 324/207.2; 324/207.12
(58) Field of Search ................ 324/207.2, 207.12, 324/207.24, 207.25, 207.26; 702/94, 96, 104, 107, 142, 145, 150, 151

(56) References Cited

U.S. PATENT DOCUMENTS

| | | | |
|---|---|---|---|
| 4,185,265 | 1/1980 | Griffin et al. .......................... 340/32 |
| 4,293,814 | 10/1981 | Boyer ................................... 324/166 |
| 4,367,721 | 1/1983 | Boyer ................................... 123/617 |
| 4,374,333 | 2/1983 | Avery ................................... 307/309 |
| 4,443,716 | 4/1984 | Avery ................................... 307/309 |
| 4,476,901 | 10/1984 | Sainen .................................. 139/370 |
| 4,705,964 | 11/1987 | Higgs ................................... 307/278 |
| 4,906,928 | 3/1990 | Gard ..................................... 324/240 |
| 4,992,731 | 2/1991 | Lorenzen . |
| 5,103,171 | 4/1992 | Lorenzen . |
| 5,291,133 | 3/1994 | Gokhale et al. ................. 324/207.25 |
| 5,317,258 | 5/1994 | Setzer et al. . |
| 5,442,283 | 8/1995 | Vig et al. ........................... 324/207.2 |
| 5,459,398 | 10/1995 | Hansen et al. ........................ 324/166 |
| 5,477,142 | 12/1995 | Good et al. ........................... 324/166 |
| 5,493,219 | 2/1996 | Makino et al. .................. 324/207.25 |
| 5,497,086 | 3/1996 | Bicking ............................ 324/207.25 |
| 5,510,706 | 4/1996 | Good ..................................... 324/166 |
| 5,650,719 | 7/1997 | Moody et al. ........................ 324/166 |
| 5,729,127 | 3/1998 | Tamura et al. ........................ 324/174 |
| 5,821,745 | 10/1998 | Makino et al. . |
| 5,917,320 | * 6/1999 | Scheller et al. ....................... 324/166 |

FOREIGN PATENT DOCUMENTS

| | | |
|---|---|---|
| 0 036 950 | 2/1981 | (EP) . |
| 0 602 697 A1 | 11/1993 | (EP) . |
| 0 621 460 A1 | 4/1994 | (EP) . |
| 0 875 733 A2 | 4/1998 | (EP) . |
| 0 875 774 | 11/1998 | (EP) . |
| 2309311 | 1/1997 | (GB) . |

OTHER PUBLICATIONS

"*Motorola Linear/Interface Integrated Circuits*", data sheet, Series D, Motorola Inc., 1983, two pages.

(List continued on next page.)

*Primary Examiner*—Walter E. Snow
(74) *Attorney, Agent, or Firm*—Daly, Crowley & Mofford, LLP

(57) ABSTRACT

A method for detection of passing magnetic articles which includes an initial step of sensing an ambient magnetic field and generating a voltage, Vsig, proportional to the magnetic field. A threshold voltage is generated as a percentage of the peak-to-peak voltage of Vsig. The method further includes the step of generating a detector output voltage that becomes one binary level when Vsig rises to exceed the threshold voltage and another binary level when Vsig falls to below the threshold voltage. The threshold voltage is updated to track the positive and negative peaks of the Vsig voltage and is further updated by a predetermined amount upon each transition of the Vout voltage.

15 Claims, 23 Drawing Sheets

OTHER PUBLICATIONS

*Operational Amplifiers Design and Applications,* Jerald G. Graeme, et al., McGraw–Hill Book Company, pp. 1, 352–353, not dated.

"ATS630,ATS631: True Power On, Self–Calibrating Zero Speed Gear Tooth Sensor System", Preliminary Data Sheet, Allegro MircroSystems, Inc., REV. 2.6; R. Vig, pp. 1–8, not dated.

"An Engineering Approach to Digital Design", William I. Fletcher, pp. 14–19, Prentice Hall, Inc., 1980.

"Data Acquistition and Conversion Handbook", pp. 16–17, Datel–Intersil, Inc., Mansfield, Massachusetts, 1979.

"ATS612LSB, Advanced Information Data Sheet", Data sheet 27627.101, Allegro MicroSystems, Inc., 115 Northeast Cutoff, Box 15036, Worcester, Massachusetts 00615–0036, pp. 1–16, Sep. 6, 1996.

"ATS630LSA and ATS631LSA, Zero–Speed, Self–Calibrating, Hall–Effect Gear–Tooth True Power–On Sensors",Data sheet 27627.120, Allegro MicroSystems, Inc., 115 Northeast Cutoff, Box 15036, Worcester, Massachusetts 01615–0036, twelve pages,, Oct. 28, 1996.

\* cited by examiner

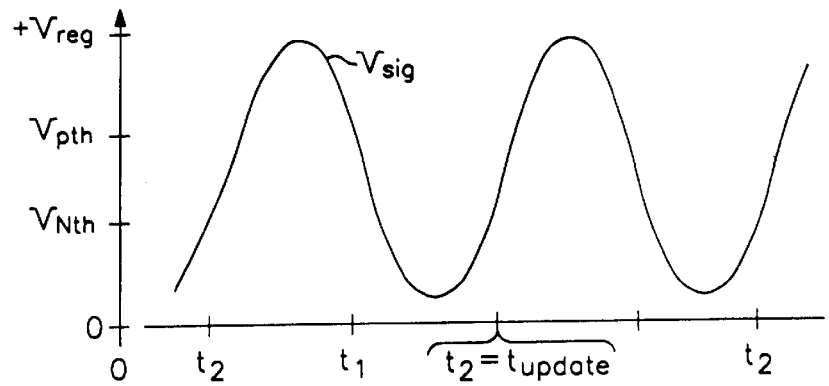
FIG. 6
FIG. 7 LATCH SIGNAL
FIG. 8 RESET SIGNAL
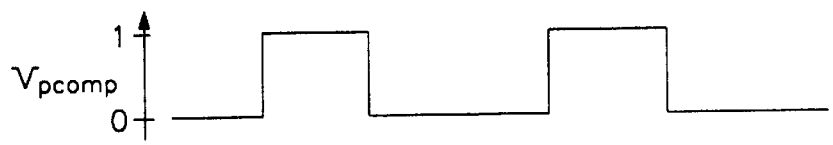
FIG. 9 $V_{pcomp}$
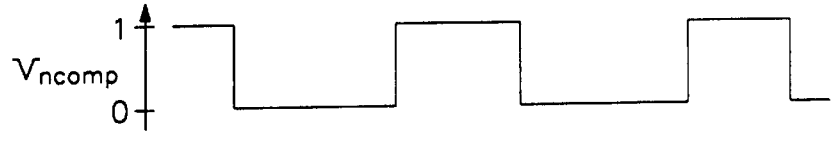
FIG. 10 $V_{ncomp}$
FIG. 11 $Q_{33b}$
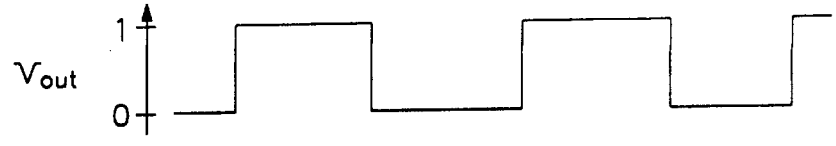
FIG. 12 $V_{out}$

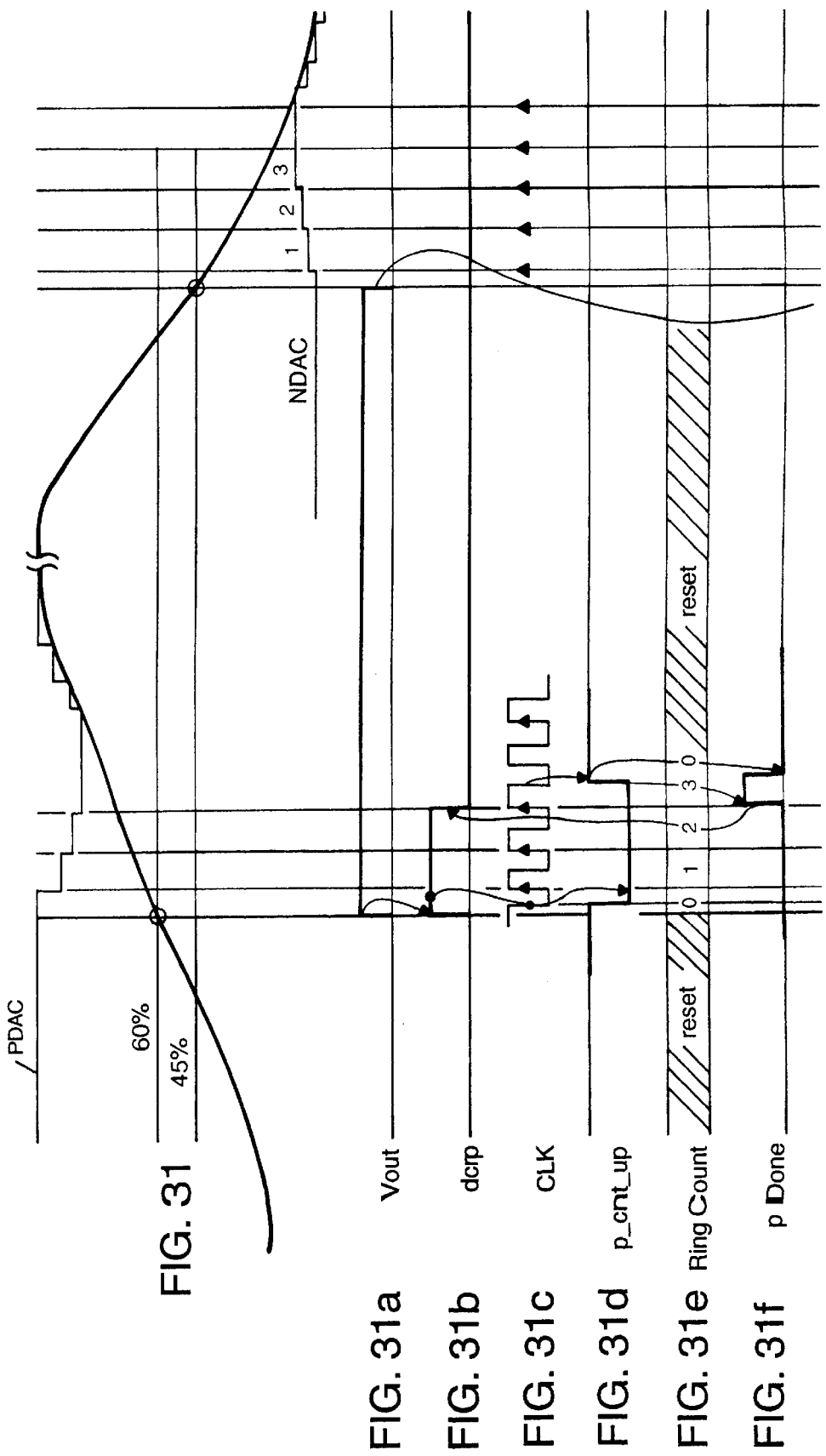

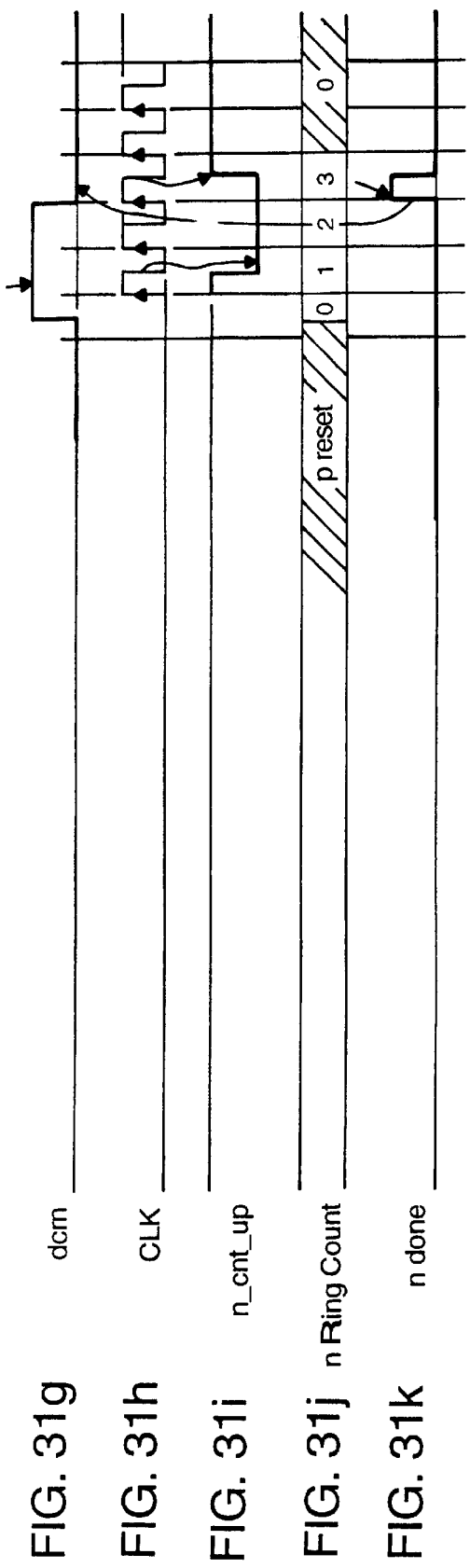
FIG. 31g  dcm
FIG. 31h  CLK
FIG. 31i  n_cnt_up
FIG. 31j  n Ring Count
FIG. 31k  n done

DETECTION OF PASSING MAGNETIC ARTICLES WHILE ADAPTING THE DETECTION THRESHOLD

CROSS-REFERENCE TO RELATED APPLICATIONS

This application is a continuation-in-part application of U.S. patent application Ser. No. 08/847,703 entitled "DETECTION OF PASSING MAGNETIC ARTICLES WHILE PERIODICALLY ADAPTING DETECTION THRESHOLD" filed on Apr. 28, 1997, now U.S. Pat. No. 5,917,320, which is a continuation-in-part application of U.S. patent application Ser. No. 08/587,407, filed on Jan. 17, 1996, now U.S. Pat. No. 5,650,719.

STATEMENTS REGARDING FEDERALLY SPONSORED RESEARCH

Not applicable.

BACKGROUND OF THE INVENTION

This invention relates to a proximity detector including a Hall-voltage peak-to-peak percentage threshold detector, and especially to a ferrous-gear-tooth Hall-transducer, or other magnetic-field-to-voltage transducer, capable of detecting the leading and trailing gear tooth edges of an adjacent rotating ferrous gear, or other magnetic articles, and more particularly relates to such a Hall sensor with detection thresholds that adapt to the peak to peak amplitude of the Hall voltage.

The term "magnetic" as used herein applies to magnetized bodies, ferrous bodies and other bodies having a low magnetic reluctance that tend to alter the ambient magnetic field.

In the patent U.S. Pat. No. 5,442,283, issued Aug. 15, 1995 there is described a proximity detector including a Hall-voltage slope-activated, or peak-referenced detector capable of detecting the rising and falling edges of a gear tooth. The detector includes a circuit for tracking a slope of a Hall voltage and briefly holding the ensuing peak voltage before producing a pulse signal indicating the onset of the following Hall-voltage slope of opposite direction. The Hall voltage holding circuit includes a capacitor and circuit means for controllably leaking charge out of or into the capacitor for preventing false tripping of a comparator that provides a pulse output signal. The holding voltage of the capacitor thus has a droop which leads to increasing loss of holding accuracy as the speed of gear tooth passage becomes slower, and therefore the detector has a minimum gear tooth speed at which accurate detection is possible.

The changes in the ambient magnetic field and corresponding changes in the transducer voltage caused by the passing of magnetic articles tend to vary. Most such proximity detectors of the prior art produce a high binary output voltage indicating proximity of a passing article, and produce a low binary voltage when the article recedes from the detector.

The transition in detector output voltage from low to high typically is triggered by a comparator that determines when the transducer voltage rises to equal a fixed internal threshold voltage reference, or in the case of the above described slope-activated, or peak-referenced detector, determines when a transducer voltage peak has just occurred and the signal voltage drops a predetermined incremental voltage from the peak value.

These prior art proximity detectors, having fixed threshold voltages, produce a low to high (or high to low) output voltage that corresponds to different locations in the transducer voltage waveform when there are changes in the amplitude of the transducer voltage.

The sources of such changes in transducer voltage amplitude are many. For example, gear teeth (articles) may have different ferro-magnetic properties from tooth to tooth and undulating changes in the spacings (air gap) gear teeth to transducer caused by eccentricity of the gear. Also, changes in temperature can cause changes in air gap dimensions and in the sensitivity of the transducer and transducer-voltage amplifier. Furthermore, the magnetic-field-to voltage transducer in a proximity detector typically includes an internal DC offset voltage that varies with mechanical stresses and temperature.

Such changes in the transducer voltage therefore cause shifts in the timing of proximity detection relative to the actual distances of article approach and receding at which these transducer voltages exceed or fall below the fixed thresholds. This results in loss of accuracy in proximity detection that has become less and less tolerable especially when employed for detection of the rotational position of a gear by sensing the proximity of the gear teeth.

It is an object of this invention to provide a proximity detector that generates a binary output voltage wherein the transitions accurately correspond to a definite point of approach and a definite point of receding of a passing magnetic article.

It is a further object of this invention to provide a magnetic article proximity detector that periodically determines when the amplitude or offset of the magnetic-field-to-voltage transducer voltage has changed significantly, and adjusts the detection threshold as needed to be essentially a predetermined constant percentage of the peak to peak value of a changing detector-transducer-voltage amplitude.

BRIEF SUMMARY OF THE INVENTION

The invention relates to a method for detecting passing magnetic articles which includes an initial step of sensing an ambient magnetic field and generating a voltage, Vsig, proportional to the magnetic field. A threshold voltage is generated as a percentage of the peak-to-peak voltage of Vsig. The method further includes the step of generating a detector output voltage that becomes a first binary level when Vsig rises to exceed the threshold voltage and a second binary level when Vsig falls to below the threshold voltage. More particularly, a PDAC voltage is generated as a function of the positive peak values of Vsig and an NDAC voltage is generated as a function of the negative peak values of Vsig. The threshold voltage is updated by a predetermined amount upon each transition of the detector output voltage and is further updated to track the positive and negative peaks of the Vsig voltage.

With this arrangement, a relatively simple and robust circuit and technique are provided for updating the PDAC and NDAC voltages to ensure that the threshold voltage remains, within a predetermined tolerance, a percentage of the peak-to-peak Vsig voltage. This method further provides additional hysteresis which serves to reduce the susceptibiltiy of the circuit to noise on the Vsig signal and which is introduced at a time when the switch points defining transitions of the detector output voltage are not affected. Further, the method has a relatively fast response time, since complex threshold voltage updating decisions are eliminated by updating the threshold voltage by a predetermined amount after transitions of the detector output voltage. Additionally, the simplicity of the threshold voltage updating technique results in simplified circuit testing and thus, a reduction in manufacturing time and cost.

The threshold voltage is at a first level corresponding to a first percentage of the peak-to-peak Vsig voltage when Vsig exceeds the threshold voltage and is at a second level corresponding to a second percentage of the peak-to-peak Vsig voltage when Vsig is less than the threshold voltage. With this arrangement, the threshold voltage is provided with hysteresis. More particularly, the first level of the threshold voltage is a first percentage of the voltage PDAC−NDAC and the second level of the threshold voltage is a second percentage of the voltage PDAC−NDAC.

The threshold voltage updating step includes decreasing the PDAC voltage by the predetermined amount upon transitions of the detector output signal from one of the binary levels to the other and increasing the NDAC voltage by the predetermined amount upon opposite transitions of the detector output signal. The threshold voltage updating step further includes permitting the PDAC voltage to track the positive peaks of the Vsig signal and permitting the NDAC voltage to track the negative peaks of the Vsig voltage.

Also described is a magnetic article detector comprising a magnetic field sensor providing a voltage output signal, Vsig, proportional to the magnetic field, a threshold voltage generator operative to generate a threshold voltage that is a percentage of the peak-to-peak voltage of Vsig and a comparator comparing Vsig to the threshold voltage to generate a detector output voltage. The detector output voltage becomes one binary level when Vsig rises to exceed the threshold voltage and another binary level when Vsig falls to below the threshold voltage. The threshold voltage is updated by a predetermined amount upon each transition of the detector output voltage and is further updated to track the positive and negative peaks of the Vsig voltage. A hysteresis circuit provides the threshold voltage at a first level that is a first percentage of the peak-to-peak voltage of Vsig when Vsig exceeds the threshold voltage and at a second level that is a second percentage of the peak-to-peak voltage of Vsig when Vsig is below the threshold voltage.

The threshold voltage generator includes a PDAC voltage generator, an NDAC voltage generator, and a circuit coupled between the PDAC voltage and the NDAC voltage for providing the threshold voltage as a percentage of the difference between the PDAC voltage and the NDAC voltage. The PDAC voltage generator includes a first counter having an output at which a first count signal is provided and a first digital to analog converter having an input coupled to the output of the first counter and an output at which the PDAC voltage is provided. The first counter counts up causing the PDAC voltage to increase when the Vsig voltage is greater than the PDAC voltage, thereby causing the PDAC voltage to track the positive peaks of the Vsig voltage. The first counter counts down for a predetermined duration upon transitions of the detector output voltage of a first polarity, thereby decreasing the PDAC voltage by a predetermined amount. Similarly, the NDAC voltage generator includes a second counter having an output at which a second count signal is provided and a second digital to analog converter having an input coupled to the output of the second counter and an output at which the NDAC voltage is provided. The second counter counts down causing the NDAC voltage to track the negative peaks of the Vsig voltage and counts up for a predetermined duration upon transitions of the detector output voltage of a second polarity, thereby increasing the NDAC voltage by a predetermined amount.

BRIEF DESCRIPTION OF THE DRAWINGS

FIGS. 2 and 3 are drawn to the same scale.

FIG. 3 shows the waveform of the output signal, Vout, from the proximity detector of FIG. 1, corresponding in time to the Hall voltage waveform of FIG. 2.

FIG. 6 shows a few periods of the transducer signal Vsig in which an update interval terminates at tupdate and a successive tupdate interval begins.

FIGS. 7, 8, 9, 10, 11 and 12 show, for the proximity detector of FIG. 1, the waveforms respectively of the input signal to latches 42 and 52, the reset signal to counters 17 and 27, Vpcomp, Vncomp, Q33b, and the proximity-detector output signal Vout, all drawn to the time scale corresponding to that of FIG. 6.

FIGS. 20a, 20b, 20c, 20d, 20e, 20f and 20g show, for the detector of FIG. 13, respective waveforms of the cnt128 signal, the Vout signal, the p_ok signal, the upd_pdac signal, the dcrp signal, the p_cnt_up signal and the clk signal, all drawn to the same time scale as FIG. 20.

FIGS. 26a, 26b, 26c, 26d, 26e, 26f, 26g, 26h and 26i show, for the detector of FIG. 21, respective waveforms of the pcomp signal, the p_latbig signal, the p_cnt_up signal, the p_ok signal, the p_latsm signal, the p_update signal, the phold signal, the CLK signal and the cnt128 signal, all drawn to the same time scale as FIG. 26.

FIG. 29b is an expanded view of a portion of the Vsig and VTH threshold voltages of FIG. 29.

FIG. 31 shows a waveform of Vsig, with the PDAC and NDAC voltages and the VTH threshold voltage superimposed thereon.

FIGS. 31a, 31b, 31c, 31d, 31e, 31f, 31g, 31h, 31i, 31j, and 31k show, for the detector of FIG. 27, respective waveforms of the Vout signal, the dcrp signal, the CLK signal, the p_cnt_up signal, the count of the positive ring counter, the pdone signal, the dcrn signal, the CLK signal, the n_cnt_up signal, the cout of the negative ring counter, and the ndone signal, all drawn to the same time scale as FIG. 31.

DETAILED DESCRIPTION OF THE INVENTION

Figure 1:
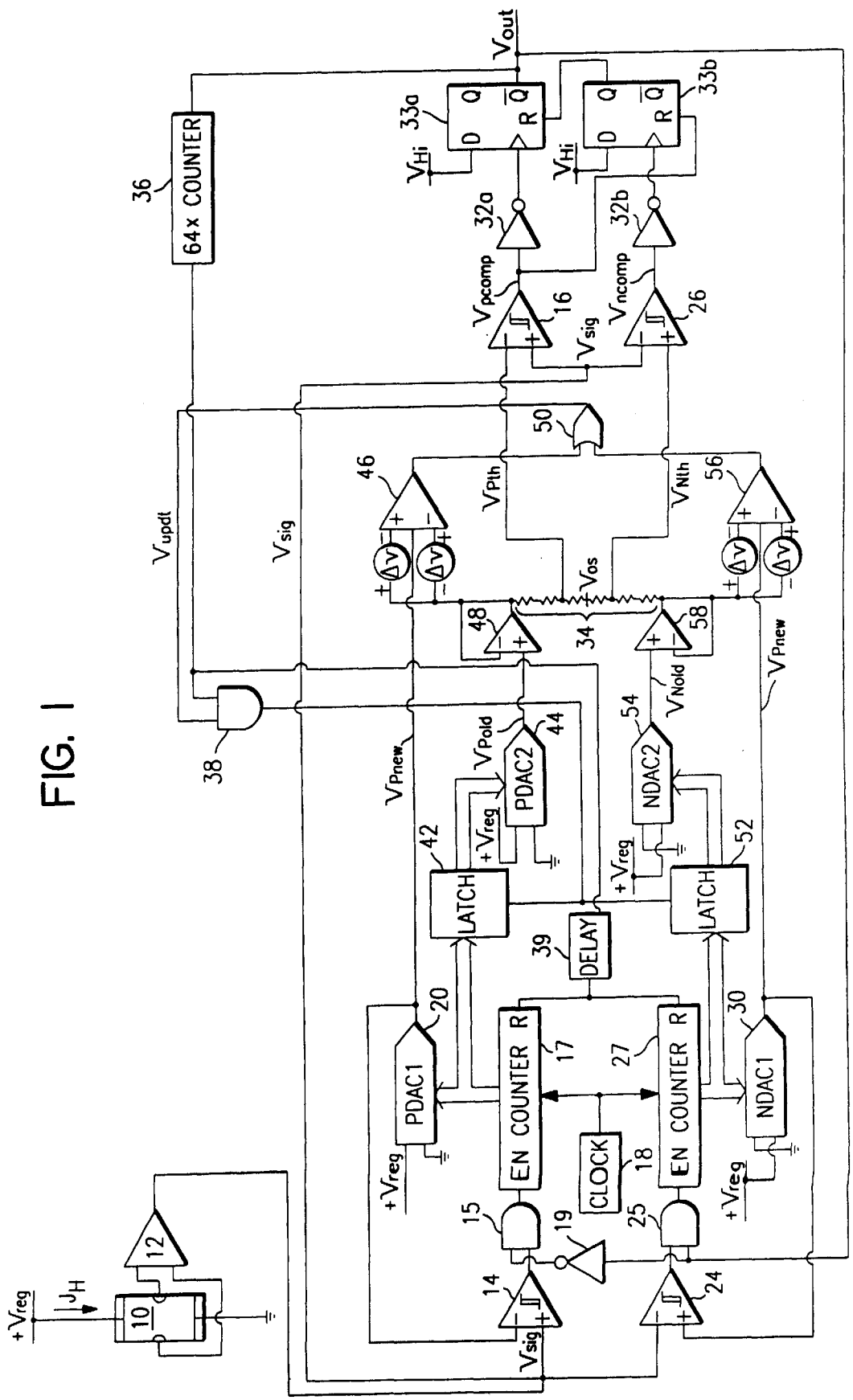
FIG. 1 shows a block diagram of a first magnetic-article proximity detector.

The Hall element 10 of FIG. 1 is energized by a current $I_H$ and has an output connected to the input of a Hall voltage amplifier 12. Hall element 10 may be mounted at a pole of a magnet (not shown), so that when a ferrous article approaches, the Hall voltage $V_H$ and the amplified Hall voltage Vsig increase (or decrease); and when the article recedes, $V_H$ and Vsig decrease (or increase depending on the polarity of the magnet pole). Alternatively, the sensor circuit of FIG. 1 may be used to detect magnetic articles that themselves are magnetized, in which case the Hall element need not be mounted adjacent a magnet.

A magneto resistors bridge (not shown) may be substituted for the Hall element. And two Hall elements with their outputs connected differentially to the input of the Hall voltage amplifier (not shown) represents a second alternative magnetic-field-to-voltage transducer.

The amplified Hall voltage Vsig is manipulated by the remaining circuits in the proximity detector of FIG. 1 to produce a binary square wave output signal, Vout, that like a shadow graph reflects the profile of the passing articles.

Referring to FIG. 1, the amplified Hall voltage Vsig is applied to the positive input of a first comparator 14 and is also applied to the positive input of one second comparator 16 and to the negative input of another second comparator 26 which generate Vpcomp and Vncomp respectively (FIGS. 9 and 10). A composite latch, composed of the invertors 32a and 32b and the clocked flip-flops 33a and 33b for producing an intermediate signal Q33b (FIG. 11) and proximity-detector output voltage Vout (FIG. 12). The circuitry including comparators 16 and 26, invertors 32a and 32b, and flip flops 33a and 33b comprise a peak-to-peak percentage threshold detector in which the comparator hysteresis circuitry biases the center of the comparator hysteresis loop to a level corresponding to a predetermined percentage of the peak-to-peak transducer signal.

Figure 2:
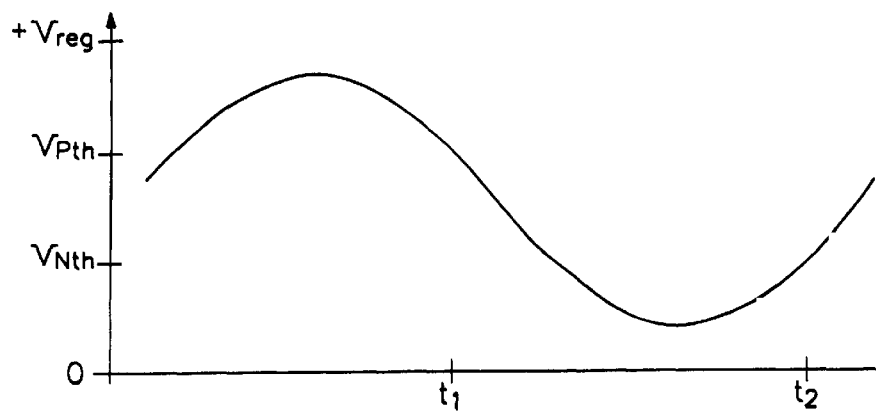
FIG. 2 shows a waveform of the Hall voltage, Vsig, in the circuit of FIG. 1 which waveform corresponds to the ambient magnetic field at the passage of one ferrous gear tooth (or other magnetic article).
Figure 3:
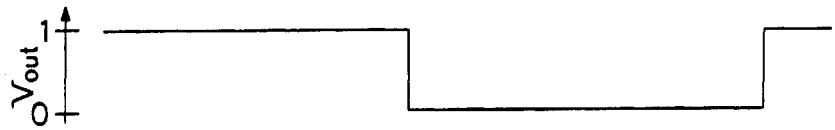

Referring to FIGS. 2 and 3, and also to FIGS. 6 and 9, during each positive going portion of Vsig, the voltage Vsig falls from the positive peak and at time $t_1$ goes below the threshold reference voltage $V_{Pth}$, produced at a tap in the resistive voltage divider 34. At times $t_1$, the output $V_{pcomp}$ of comparator 16 goes from a binary high to a low level as in FIG. 9, and Vout goes from a high to a low level as seen in FIG. 12.

During each negative going portion of Vsig, the voltage Vsig rises (or falls away) from the negative peak and at time $t_2$ goes above the threshold reference voltage $V_{Nth}$, produced at low tap in the resistive voltage divider 34. At times $t_2$, the output $V_{ncomp}$ of comparator 16 goes from a binary low to a high as in FIG. 10, and Vout goes from a low to a high level as seen in FIG. 12.

Assuming, as a starting point, that the counter 17 is at zero count, when the output of the first comparator 14 goes high the counter 17 begins counting the clk pulses from clk 18. The resulting count is presented to the digital-to-analog converter (PDAC1) 20 which produces an output analog voltage $V_{Pnew}$ always lying somewhere within the range from zero to the DC supply voltage, +Vreg. At any instant the amplitude of $V_{Pnew}$ is a direct linear function of the count signal from counter 17. When power is first applied to the detector circuit, a logic block (not shown) senses the time of turning on of the DC supply voltage, +Vreg, and resets the counters to zero count.

Figure 4:
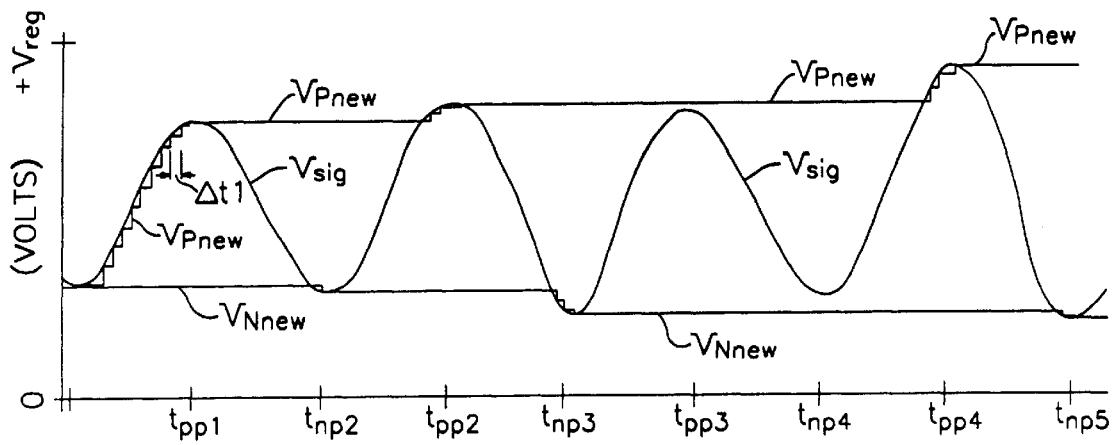
FIG. 4 shows a waveform of signal, Vsig, attributable to the passing of a plurality of magnetic articles that generate uneven amplitudes from one to the other in the ambient magnetic field. Shown superimposed on Vsig are the simultaneously generated DAC output voltages $V_{Pnew}$ and $V_{Nnew}$.

The comparator 14 has hysteresis and so is a Schmitt type comparator. The output of the DAC 20 (PDAC1) is connected to the negative input of the comparator 14 so that whenever Vsig becomes greater than voltage $V_{Pnew}$ plus the small hysteresis threshold voltage $V_{hys1}$ of the comparator 14, then the comparator 14 output goes high. If at that time Vout is low, then the output of AND gate 15 goes high and the counter 17 is enabled and counting. When Vsig is growing more positive, $V_{Pnew}$ is caused to track Vsig in stair step fashion, as is illustrated in FIG. 4. The incremental vertical excursions of the stair stepped $V_{Pnew}$ are equal to Vreg/$2^n$, where n is the number of DAC bits. The incremental horizontal times, $\Delta t1$, increase as the slope of Vsig decreases.

As is illustrated in FIG. 4, when a peak positive voltage of Vsig is reached, the counter 17 stops counting (e.g. at time $t_{pp1}$) and $V_{Pnew}$ holds this peak voltage until at a subsequent positive pulse in the signal Vsig that is greater than the held voltage $V_{Pnew}$, $V_{Pnew}$ again begins to track the subsequent positive pulse to its peak and to hold (e.g. at time $t_{pp2}$) that new peak voltage.

An update counter 36 is a six bit counter which counts the low-to-high transitions, i.e. positive transitions, in the proximity-detector output signal Vout. When at time $t_{update}$, 64 positive binary transitions have been counted, counter 36 wraps and starts again from zero count to count the ensuing positive transitions. Referring to FIGS. 5, 5a, 6, 7 and 8, at $t_{update}$ the output of the update counter 36 goes high and latches 42 and 52 are enabled and then disabled before the counter 17 (and counter 27) is (are) reset via the delay circuit 39.

Thus at the end of each update time interval of 64 counts, the PDAC1 output voltage $V_{Pnew}$ holds the positive peak voltage of the highest positive excursion that has occurred in the signal Vsig during that update time interval. The most recent maximum peak positive voltage in Vsig is accordingly updated at the end of each update time interval of a predetermined number of excursions of one polarity in Vsig. The predetermined (count) number in this example was set at 64 positive excursion peaks and the counter 36 is accordingly a six bit counter, but this number is not critical.

At the end of each count 64, the output of the update counter 36 goes high to enable the update AND gate 38. If the update signal, Vupdt, is simultaneously high, the output of the update AND gate 38 goes high and enables the latch 42. Latch 42 holds the count in counter 17 during the following update time interval (of 64 pulses in Vsig). That count is applied to the input of PDAC2 44 during that update time interval. At the end of the first update time interval following detector startup, PDAC2 44 generates at its output an analog signal $V_{Pold}$ that is equal to the initial amplitude of Vsig at the beginning of the first update time interval (left-most update time interval as seen in FIG. 5).

A window comparator 46 has a reference-voltage input connected to the output of PDAC1 20. The output signal $V_{Pold}$ from PDAC2 is applied via a unity gain buffer stage 48 to one end of the resistor voltage divider 34. And from there the signal $V_{Pold}$ is applied to the plus and minus inputs of the window comparator 46 via respectively the additive and subtractive DC bias voltages $\Delta v$.

Figure 5:
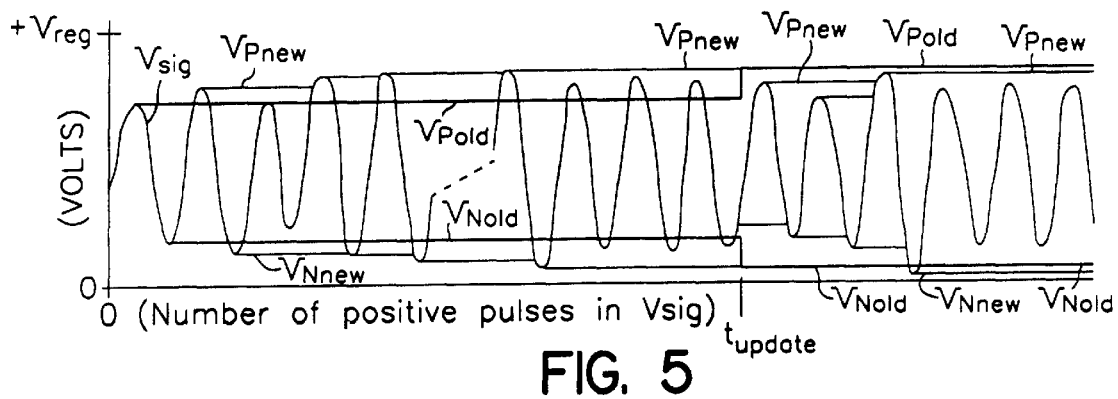
FIG. 5 shows a waveform of Vsig during one update interval of 64 pulses in Vsig and during a portion of a succeeding update interval, wherein the peak positive and negative values in Vsig are changing. Superimposed on Vsig are the DAC voltages $V_{Pnew}$ and $V_{Nnew}$, in the one interval and $V_{Pnew}$ and $V_{Nnew}$ in the succeeding update interval.
Figure 5A:
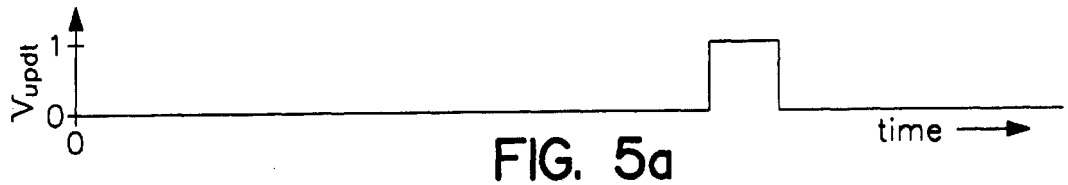
FIG. 5a shows a waveform of the update signal, Vupdt, drawn to the scale as is FIG. 5.

Referring to FIG. 5, at the end of an update time interval, time $t_{update}$, the output of window comparator 46 goes high only if $V_{Pnew}$ lies outside of the range from $V_{Pold}+\Delta$ and $V_{Pold}-\Delta$. If at the end of an update interval, $V_{Pnew}$ is higher than or lower than this range then the output of the window comparator goes high causing the output of OR gate 50 to go high. This in turn causes the output of AND gate 38 to go high, and causes latch 42 to latch in the current count in counter 17. As is illustrated in FIG. 5, this updates $V_{Pold}$, namely PDAC2 44 generates at its output an analog signal $V_{Pold}$ that is equal to the initial amplitude of the held $V_{Pnew}$ generated during the preceding update time interval. All update time intervals following the first update time interval begin with a decision as to whether to update $V_{xold}$ to the last held value of $V_{xnew}$ of the preceding time interval as illustrated in the second time interval of FIG. 5.

If the current value of $V_{new}$, namely the maximum peak positive peak value of Vsig during an entire update time interval, is not outside of and lies within the range from $V_{Pold}+\Delta$ and $V_{Pold}-\Delta$ at the end of that update time interval, then the output of comparator 46 remains low and latch 42 will not be enabled.

A lower circuit portion in the proximity detector of FIG. 1 essentially mirrors the construction of the upper portion just described. The lower circuit portion manipulates the negative pulses in Vsig in the same way as does the upper portion with respect to positive pulses in Vsig. Except for the holding of negative peaks in Vsig by NDAC1 30, latch 52 and NDAC2, there is no action going on in the lower circuit portion during positive going portions of Vsig.

For example, the output of comparators 24 and 26 go high only when Vsig goes negative. Thus only when Vsig is going negative are there changes of state in the signals of AND gate 25, counter 27, NDAC1 30, latch 52, NDAC2 54, buffer 58 and window comparator 56. The upper (P) and lower (N) portions of the circuit share the clk 18, the reset delay circuit 39 and the OR gate 50. It should be noted that the DC reference voltages +Vreg and ground are connected to NDAC1 30 and NDAC2 54 inversely with respect to those connections to PDAC1 20 and PDAC2 44. Thus instead of the output voltage going up as the count increases (in counter 17) to the PDACs, the output voltage of the NDACs goes down as the count (in counter 27) goes up. Alternatively, the NDACS could have been connected to the DC reference voltages as are the PDACs if the counter 27 had been of the kind that counts down from maximum count. Also, the counters 17 and 27 are of the kind that include an anti-overflow feature that prevents wrapping of the count when maximum count is exceeded, whereas counter 36 is of the simple kind that does wrap. The resistive voltage divider 34 is a component that bridges the upper and lower circuit portions.

The ends of voltage divider 34 are connected respectively to the outputs of buffer stages 48 and 58. The held signal $V_{Pold}$ is applied to the upper end and the held signal $V_{Nold}$ is applied to the lower end of voltage divider 34. At the resistance center (from which there are equal resistances to the two ends) a voltage Vos is generated which is equal to the center voltage between the held positive peak voltage (of Vsig) $V_{Pold}$ and the held negative peak voltage $V_{Nold}$. The threshold voltages $V_{Nth}$ and $V_{PNth}$ are shown respectively at about a third the way up and two thirds the way up the voltage divider 34.

It will now be appreciated that these threshold voltages $V_{Nth}$ and $V_{Pth}$ have been adjusted after every update time interval to remain at a fixed percentage of the peak to peak voltage of Vsig even when the peak voltages of Vsig vary and/or when the offset voltages included in Vsig vary.

Voltage divider 34 is made up of six equal resistance resistors. The voltage Vos is 50% of the voltage Vreg. $V_{Pth}$ and $V_{Nth}$ are preferably set at about 67% and 33% of Vreg, and generally in the steepest portions of Vsig near Vos. In general, $V_{Pth}$ may be taken at the center point in the voltage divider, or may be at a higher point between 50% and 100% of the difference voltage $V_{Pnew}-V_{Nnew}$. Likewise, $V_{Nth}$ may be at the center point in the voltage divider, namely at 50% of $V_{Pnew}-V_{Nnew}$, or may be at a lower point between 50% and 0% of the difference voltage $V_{Pnew}-V_{Nnew}$. The threshold $V_{Pth}$ and $V_{Nth}$ may be other than equal magnitudes from center voltage Vos, i.e. non symmetrical.

In any case, these threshold values vary with time and are always a fixed percentage of the current (updated) peak to peak difference voltage in the signal (Vsig). This has the great advantage when operating in peak-to-peak percentage threshold mode as described above, that the proximity sensor provides a binary output voltage wherein the transitions correspond more accurately to a definite point of approach and point of receding of a passing magnetic article.

Figure 13:
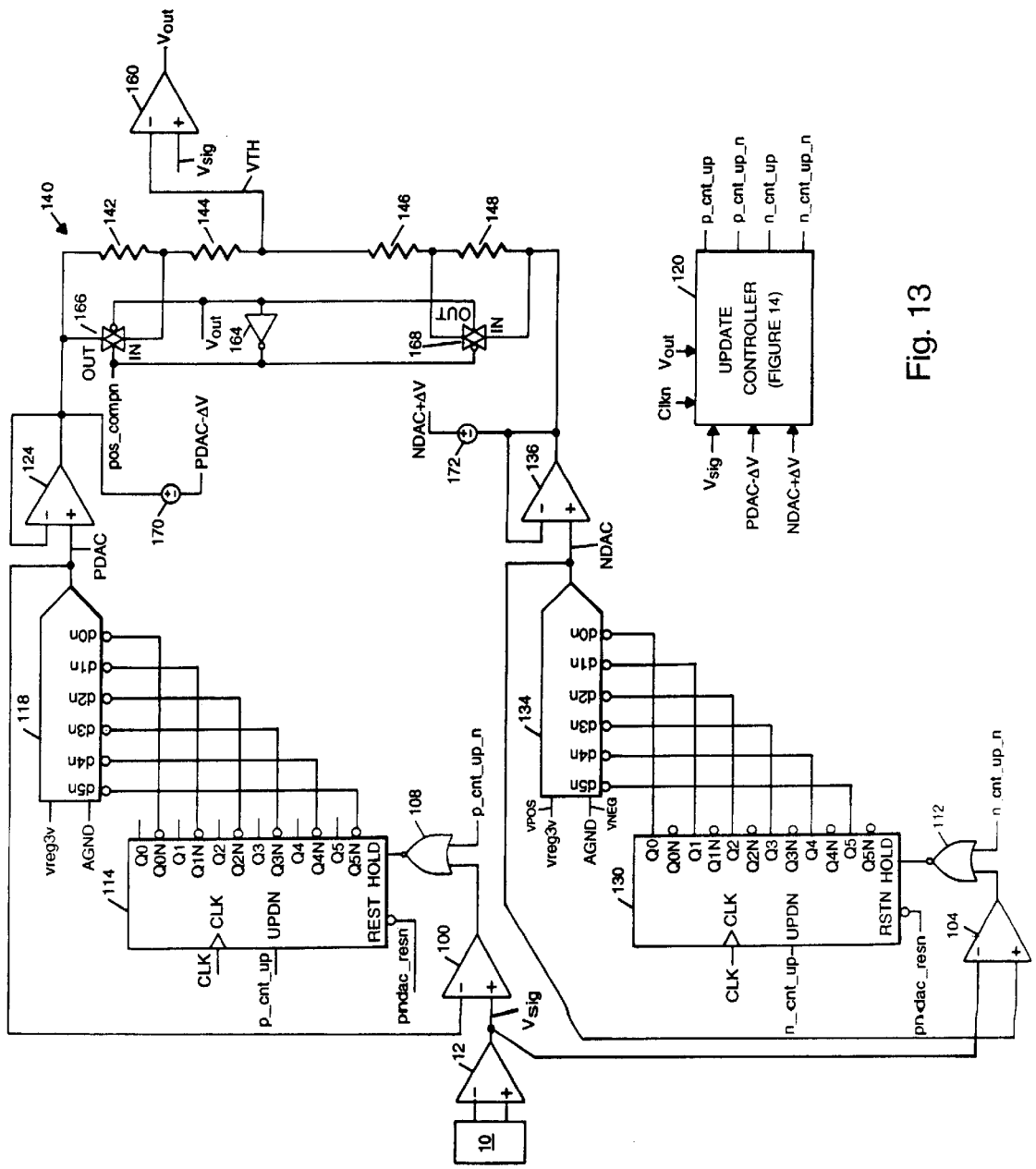
FIG. 13 shows a schematic of a second magnetic-article proximity detector.

Referring to FIG. 13, an alternate embodiment of a magnetic-article proximity detector is shown, in which like reference numbers refer to like elements. The detector includes the Hall element 10 providing a Hall voltage to the amplifier 12 which provides the amplified Hall voltage, Vsig, as described above in conjunction with FIG. 1. Like the detector of FIG. 1, the detector of FIG. 13 is operative to produce a binary square-wave output signal, Vout, at a first binary level when Vsig rises to exceed a threshold voltage and another binary level when Vsig falls to below the threshold voltage. In the embodiment of FIG. 1, the threshold voltage is comprised of the individual $V_{Pth}$ and $V_{Nth}$ voltages whereas, in the embodiment of FIG. 13, the single threshold voltage, VTH, is provided with hysteresis.

The embodiments of FIGS. 1 and 13 are further similar in that, in both cases, the threshold voltage is a percentage of the peak-to-peak voltage of Vsig and is updated to remain the percentage, within a predetermined tolerance, of the Vsig voltage. Accordingly, both such detectors can be characterized as peak-to-peak percentage threshold detectors. In the embodiment of FIG. 1, the $V_{Pth}$ threshold voltage is a first percentage of Vsig and the $V_{Nth}$ threshold voltage is a second percentage of Vsig. In the embodiment of FIG. 13 on the other hand, the VTH threshold voltage is at a first level corresponding to a first percentage of Vsig when Vsig exceeds the threshold voltage and is at a second level corresponding to a second percentage of Vsig when Vsig is less than the threshold voltage (i.e., the threshold voltage VTH is provided with hysteresis).

It will be appreciated by those of ordinary skill in the art, and is within the scope of this invention, that the detectors described herein may be implemented in the form of, or to include, mid-signal detectors in which the threshold voltage is a fixed percentage of the Vsig voltage or peak-referenced (i.e., slope-activated detectors). As one example, the peak-to-peak percentage threshold detectors may include a peak-referenced detector such that the detector output signal Vout becomes one binary level when Vsig rises to exceed a held negative peak excursion by a predetermined amount and another binary level when Vsig falls to below a held positive peak excursion by a predetermined amount.

The Vsig voltage is applied to the positive input of a first comparator 100 and to the negative input of a second comparator 104. The output signals of comparators 100 and 104 are coupled to an input of respective NOR gates 108 and 112. The second input of NOR gates 108 and 112 receives a respective control signal from an update controller 120, described further below in conjunction with FIG. 14. Specifically, NOR gate 108 has a p_cnt_up_n signal applied to its second input and NOR gate 112 has an n_cnt_up_n signal applied to its second input, as shown.

The output of NOR gate 108 is applied to a HOLD input of an up/down counter 114. The counter output is held constant (i.e., the counter is disabled) when the HOLD input signal is at a first logic level and is released (i.e., the counter is enabled) when the HOLD input signal is at the second logic level. In the illustrative embodiment, the counter 114 is a six bit counter which is enabled when the HOLD input is low. A control signal, p_cnt_up from the update controller 120 (FIG. 14) is applied to an UPDN input of the counter 114 in order to control the count direction. As will become apparent, the p_cnt_up signal normally causes the counter 114 to count up. Under certain conditions however, the p_cnt_up signal causes the counter 114 to count down for a single clock cycle. The counter 114 is clocked by a system clock signal, clk, and is further responsive to a pndac_resn signal which resets the counter 114 upon start up of the detector.

The outputs of the counter 114 are coupled to inputs of a Positive Digital-to-Analog Converter (PDAC) 118. The output of the PDAC 118 provides a voltage, PDAC, which is used to generate the detector threshold voltage, VTH, as will be described. In operation, the PDAC voltage varies in accordance with certain variations in the positive peak values of the Vsig voltage. The resolution of the PDAC 118 is selected to ensure that changes in the VTH threshold voltage caused by changes in the PDAC voltage are substantially imperceptible. In the illustrative embodiment, the resolution of the PDAC 118 is 50 mV. The PDAC voltage is coupled to a buffer 124 and is fed back to the negative input of comparator 100, as shown.

The comparator 100, NOR gate 108, counter 114, PDAC 118 and buffer 124 comprise a "positive portion" of the detector circuitry. A "negative portion" of the detector is similarly arranged. Specifically, the output of the NOR gate 112 is coupled to a HOLD input of an up/down counter 130. The counter 130 is further responsive to the clk clock signal, the pndac_resn reset signal, and an n_cnt_up control signal provided by the update controller 120 (FIG. 14) which controls the count direction.

The outputs of the up/down counter 130 are coupled to inputs of a Negative Digital-to-Analog Converter (NDAC) 134 which produces an NDAC voltage used, along with the PDAC voltage, to generate the VTH threshold voltage. The NDAC voltage varies in accordance with certain variations in the negative peak values of the Vsig voltage. Like the PDAC 118, the resolution of the NDAC 134 is selected to ensure that changes in the VTH threshold voltage caused by changes in the NDAC voltage are substantially imperceptible. In the illustrative embodiment, the resolution of the NDAC 134 is 50 mV. The NDAC voltage is coupled to a buffer 136 and is further fed back to the negative input of comparator 104, as shown.

The buffered PDAC and NDAC voltages are coupled to a resistor divider 140 comprising series resistors 142, 144, 146 and 148 in order to generate the VTH threshold voltage for comparison to the Vsig voltage by a comparator 160. The output of comparator 160 provides the detector output signal, Vout, which is at a first binary, or logic level when the Vsig voltage exceeds the VTH threshold voltage and is at a second binary level when the Vsig voltage is less than the VTH threshold voltage.

The VTH threshold voltage is set at a percentage of the peak-to-peak Vsig voltage and is adaptive in the sense that it is updated in accordance with certain variations in the Vsig voltage so as to remain the percentage, within a predetermined tolerance, of the peak-to-peak Vsig voltage. As will become apparent, this arrangement is achieved by using the PDAC and NDAC voltages to generate the VTH threshold voltage and varying the PDAC and NDAC voltages in accordance with certain variations in the positive and negative peak values of Vsig, respectively.

The VTH threshold voltage is provided with hysteresis in the sense that VTH is at a first level corresponding to a first percentage of the peak-to-peak Vsig voltage when Vsig exceeds the VTH threshold voltage and is at a second level corresponding to a second percentage of the peak-to-peak Vsig voltage when Vsig is less than the VTH threshold voltage. That is, once the Vsig voltage falls below the first level of the VTH threshold voltage, the VTH threshold voltage is increased so that the Vsig voltage has to exceed a second, higher level of the VTH threshold voltage before the Vout signal transitions. In the illustrative embodiment, the first and second percentages are fixed percentages of the peak-to-peak Vsig voltage, but providing the percentages as variable percentages of the peak-to-peak Vsig voltage is within the scope of the invention.

More particularly, a pair of switches 166, 168 is provided for selectively "shorting" respective resistors 142, 148. To this end, switches 166 and 168 are coupled in parallel with resistors 142 and 148 of resistor divider 140, respectively. The Vout signal from comparator 160 is inverted by an inverter 164 to provide a pos_compn signal which is applied to a control input of switches 166 and 168, as shown. A second control input of switches 166 and 168 is responsive to the Vout signal.

Figure 15:
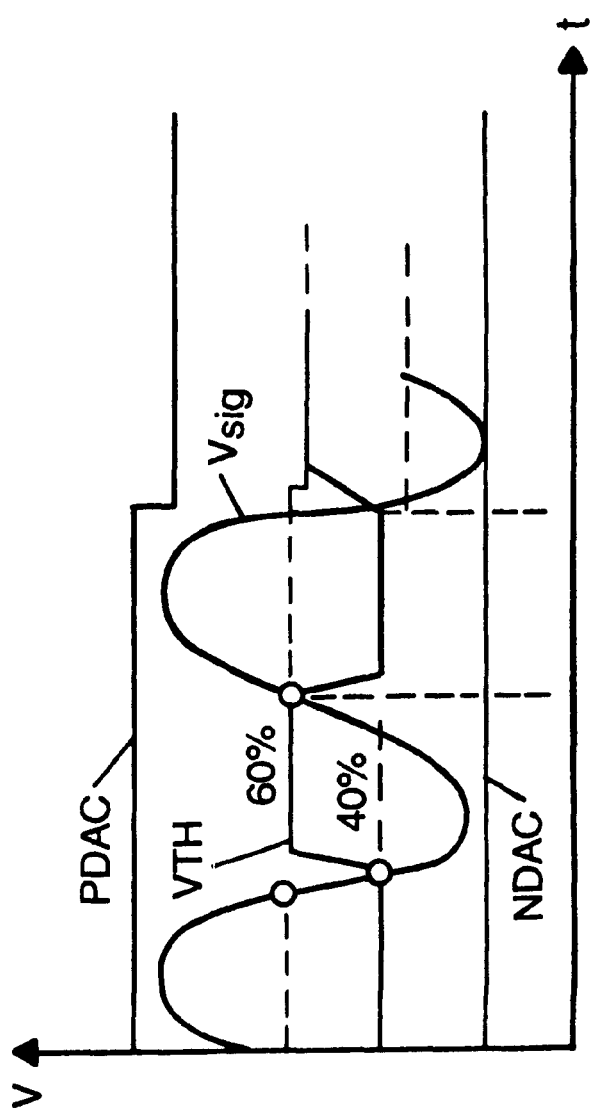
FIG. 15 shows a waveform of Vsig with the VTH threshold voltage, the PDAC voltage and NDAC voltage generated by the detector of FIG. 13 superimposed thereon.
Figure 16:
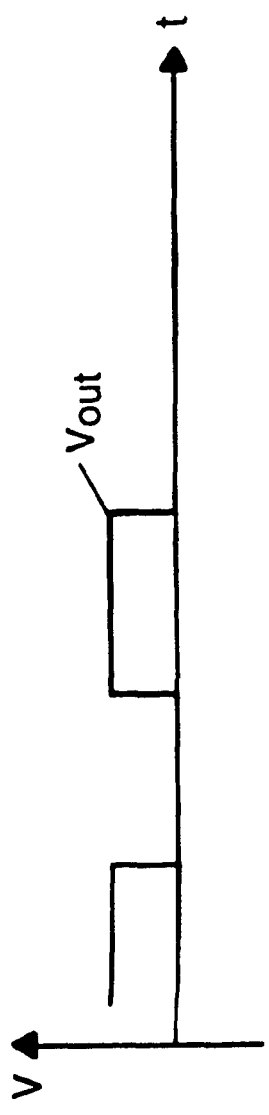
FIG. 16 shows a waveform of Vout generated by the detector of FIG. 13 during the same time interval shown in FIG. 15.

Referring also to FIGS. 15 and 16, when the Vout and pos_compn control signals are in first respective logic states, one of the switches 166, 168 is open and the other is closed. In the illustrative embodiment, when the Vout signal is at a logic high level and the pos_compn signal is at a logic low level, switch 166 is open and switch 168 is closed. Under this condition, resistor 148 is "shorted" by closed switch 168 and the VTH threshold voltage is at a first level relative to the PDAC and NDAC voltages. In the illustrative embodiment, the first level is approximately 40% of the difference between the PDAC and NDAC voltages. When the Vout signal is at a logic low level and the pos_compn signal is high, switch 166 is closed and switch 168 is open, thereby causing resistor 142 to be "shorted". Under this condition, the VTH threshold voltage is at a second level which, in the illustrative embodiment, is approximately 60% of the PDAC−NDAC voltage. Since the PDAC and NDAC voltages are updated in accordance with certain variations in the Vsig voltage as will be described, the first VTH threshold voltage level corresponds to a first percentage, within a predetermined tolerance, of the peak-to-peak Vsig voltage and the second VTH threshold voltage level corresponds to a second percentage, within a predetermined tolerance, of the peak-to-peak Vsig voltage. Generally, both the first and second percentages are between 0% and 100% of the peak-to-peak Vsig voltage. More preferably and in the illustrative embodiment, the first percentage is between 0% and 50% and the second percentage is between 50% and 100%.

Figure 14:
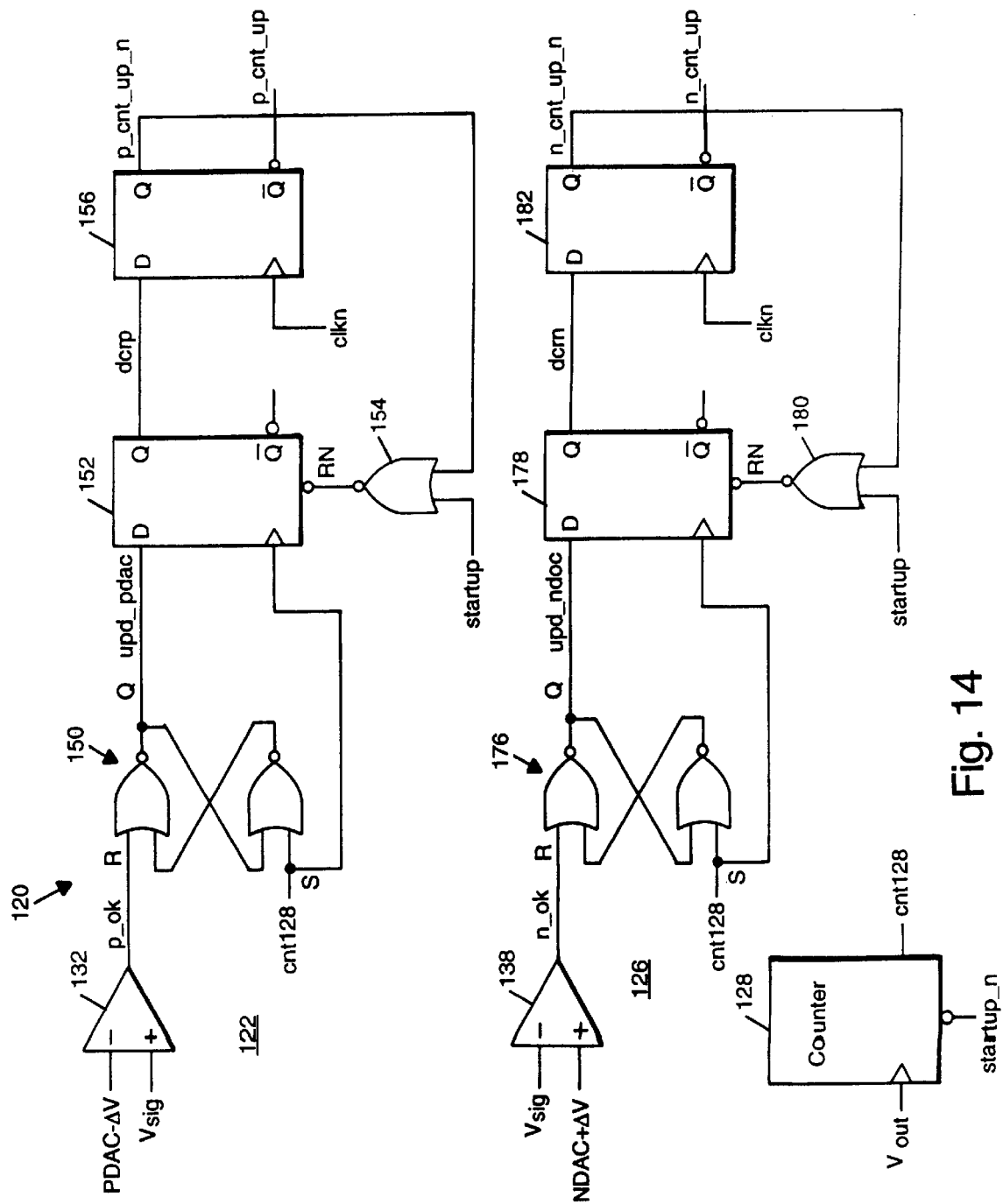
FIG. 14 shows a schematic of the update controller of the proximity detector of FIG. 13.

In order to update the PDAC and NDAC voltages in accordance with certain variations in the positive and negative peak values of the Vsig voltage, respectively, "voltage ok windows" are established for use by the update controller 120 (FIG. 14). The voltage ok windows establish the "predetermined tolerance" between the VTH threshold voltage and percentage(s) of the Vsig voltage it represents. A first voltage source 170 is coupled to the buffered PDAC voltage to generate a voltage, PDAC−ΔV, which is a predetermined voltage less than the PDAC voltage. In the illustrative embodiment, ΔV is the equivalent of two bits, or 100 mV. Similarly, a voltage source 172 is coupled to the buffered NDAC voltage to generate a voltage, NDAC+ΔV, which, in the illustrative embodiment, is the equivalent of two bits higher than the NDAC voltage. A "positive voltage ok window" used to update the PDAC voltage is defined between the PDAC and PDAC−ΔV voltages and a "negative voltage ok window" used to update the NDAC voltage is defined between the NDAC and NDAC+ΔV voltages.

Figure 17:
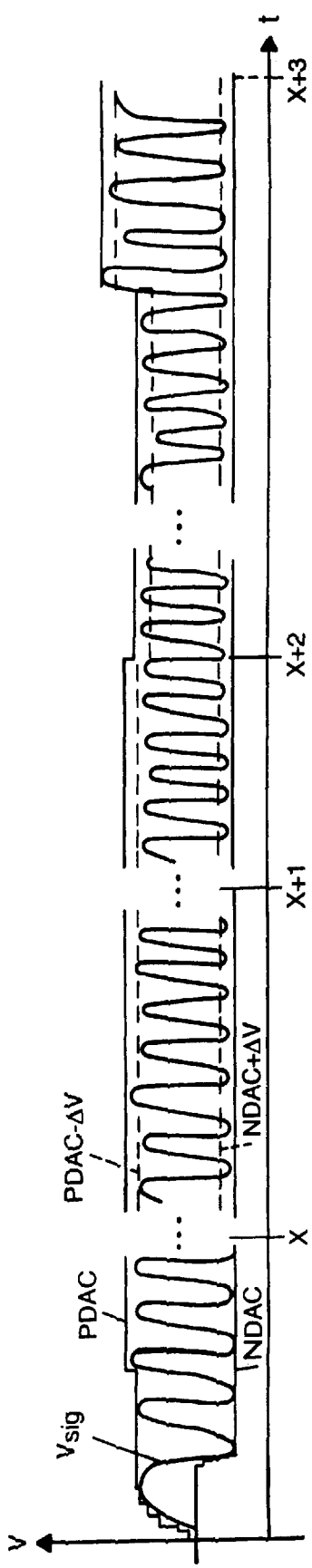
FIG. 17 shows a waveform of Vsig during several update time intervals in which the positive peak values in Vsig are changing. Superimposed on Vsig are the PDAC, PDAC−ΔV, NDAC and NDAC+ΔV voltages generated by the detector of FIG. 13.
Figure 17A:
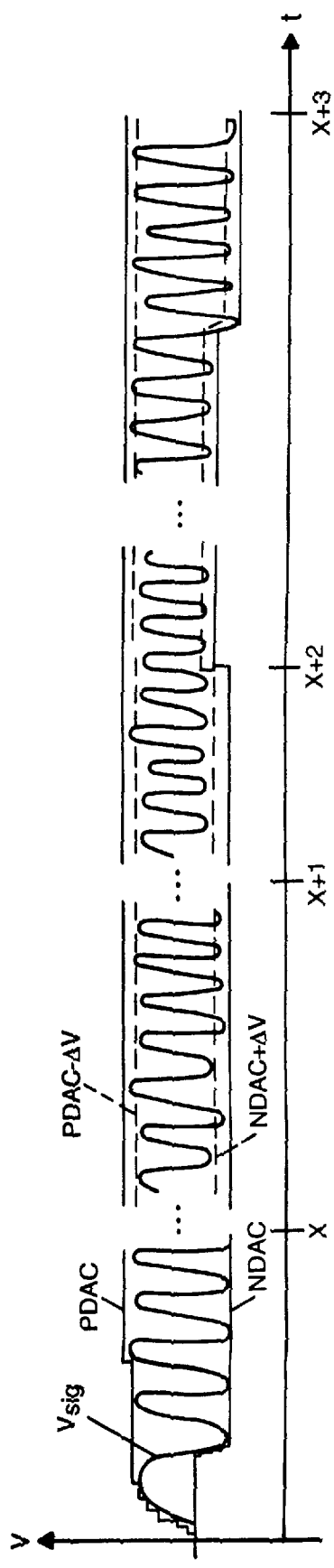
FIG. 17a shows a waveform of Vsig during several update time intervals in which the negative peak values in Vsig are changing. Superimposed on Vsig are the PDAC, PDAC−ΔV, NDAC and NDAC+ΔV voltages generated by the detector of FIG. 13.
Figure 18:
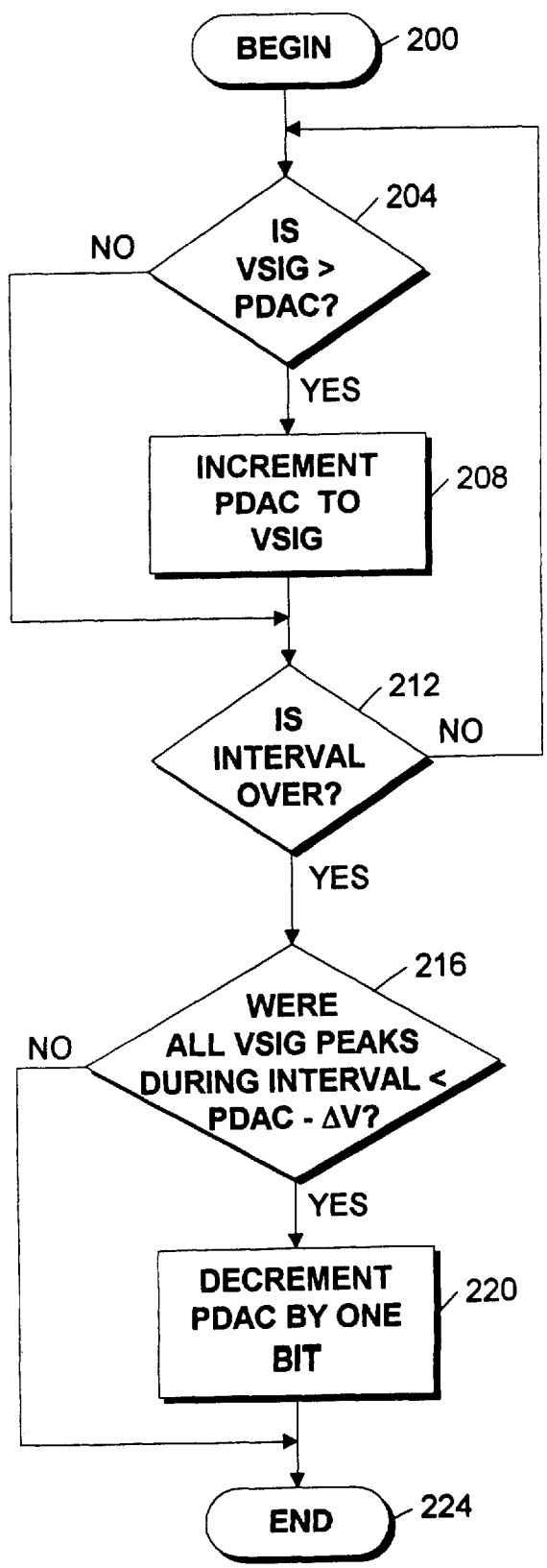
FIG. 18 is a flow diagram illustrating operation of the detector of FIG. 13 in updating the PDAC voltage in accordance with certain changes in the positive peak values of Vsig.
Figure 19:
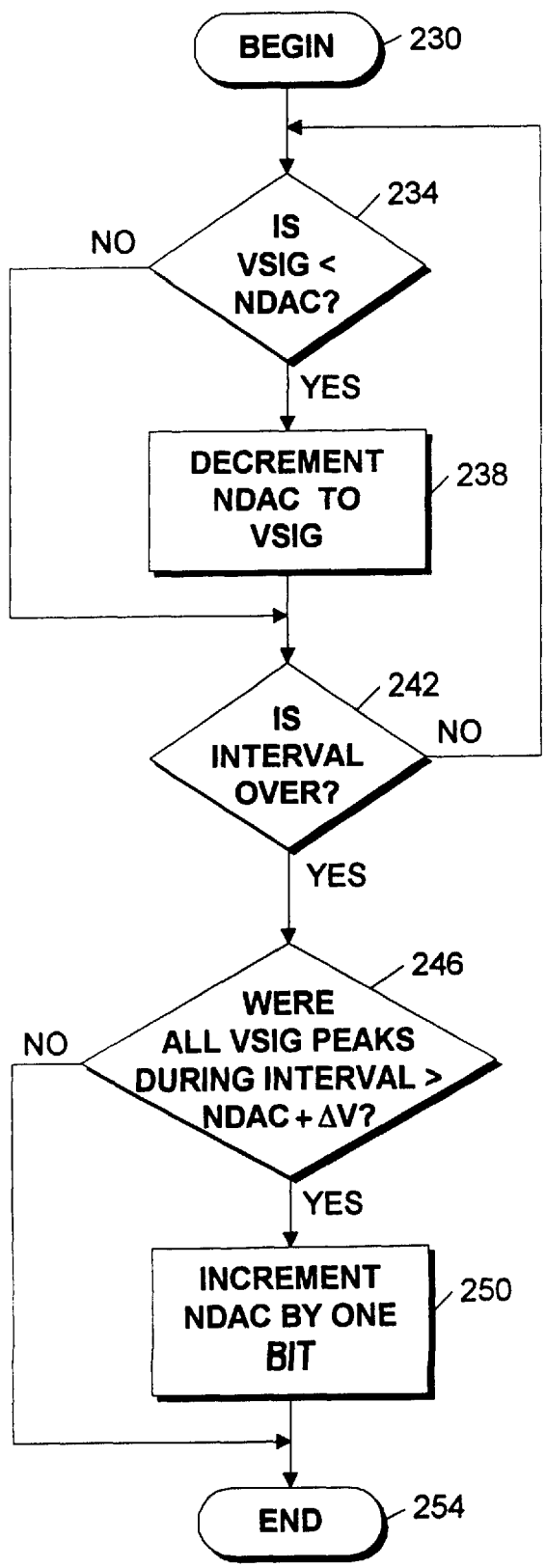
FIG. 19 is a flow diagram illustrating operation of the detector of FIG. 13 in updating the NDAC voltage in accordance with certain changes in the negative peak values of Vsig.

Referring to FIGS. 17, 17a, 18 and 19, the manner by which the PDAC and NDAC voltages are updated in accordance with variations in the positive and negative peaks of the Vsig voltage, respectively, will be described. Specifically, FIG. 17 illustrates how the PDAC voltage varies with certain variations in the positive peaks of Vsig over several updated time intervals and FIG. 18 is a corresponding flow diagram illustrating operation of the detector in updating the PDAC voltage. FIG. 17a illustrates the manner in which the NDAC voltage varies with certain variations in the negative peaks of Vsig over several update time intervals and FIG. 19 is a corresponding flow diagram. It will be appreciated by those of ordinary skill in the art that the methods illustrated by FIGS. 18 and 19 are illustrative only and may be readily varied, such as by varying the sequence of the steps.

The first time interval ending at time X follows power up of the detector and is referred to as a start up time interval. Subsequent time intervals, during and/or after which the PDAC and NDAC voltage may be updated, are referred to as update time intervals. During the start up time interval, the PDAC 118 and the NDAC 134 track the highest and lowest peaks of the Vsig voltage, respectively, as shown. Since the initial Vsig voltage is unknown, the PDAC voltage is set to a value lower than the least positive expected peak of Vsig, such as the negative voltage rail, and the NDAC voltage is set to a value greater than the least negative expected peak of Vsig, such as the positive voltage rail. The update controller 120 (FIG. 14), which is operative to update the PDAC and NDAC voltages as necessary, is disabled during the startup time interval.

After the startup time interval, at time X, if any positive peak of Vsig is within the positive voltage ok window during a given time interval, then the PDAC voltage is not updated either during or at the end of the interval, as is illustrated during the interval between times X and X+1 in FIG. 17. If, however, a positive peak value of the Vsig voltage exceeds the positive voltage ok window (i.e., exceeds PDAC), then the PDAC voltage is increased to the value of this positive peak voltage, as illustrated during the interval between times X+2 and X+3 in FIG. 17. Finally, if all of the positive peaks of the Vsig voltage during a given time interval are less than the positive voltage ok window (i.e., are less than PDAC−ΔV), then the PDAC voltage is decremented by a predetermined amount at the end of that interval, as is illustrated in the interval between times X+1 and X+2 in FIG. 17. In one embodiment, the PDAC voltage is decremented by one bit at the end of any time interval during which all positive peaks of the Vsig voltage are less than the positive voltage ok window.

Referring to FIG. 18, the method for updating the PDAC voltage as a function of the positive peaks of the Vsig voltage commences in step 200. In step 204, it is determined whether Vsig is greater than the upper boundary of the positive voltage ok window, or PDAC. If the Vsig voltage is greater than PDAC, then the PDAC voltage is incremented in subsequent step 208 to the value of the Vsig voltage. In the event that the Vsig voltage is not greater than the PDAC voltage, then it is next determined in step 212 whether the current time interval is over. Steps 204–212 are repeated until the time interval has ended.

An update time interval is comprised of a predetermined number of transitions of the Vout voltage. In the illustrative embodiment, preferably, each time interval is comprised of 128 positive (or alternatively 128 negative) transitions of the Vout signal. More generally however, it is advantageous for the time interval to be greater than one revolution of a passing magnetic article. Considering, for example, the case in which the magnetic article is a rotating gear having teeth spaced by valleys, this arrangement ensures that the highest tooth and deepest valley will be detected during each time interval.

At the end of each time interval, in step 216, it is determined whether all of the positive peaks of the Vsig voltage during that particular time interval were less than the positive voltage ok window (i.e., PDAC−ΔV). If all of the positive Vsig peaks during the particular interval were less than PDAC−ΔV, then the PDAC voltage is decremented by a predetermined amount in step 220, following which the process terminates in step 224. In the illustrative embodiment, the predetermined amount by which the PDAC voltage is decremented is one bit, or fifty millivolts. If however, not all of the positive peaks of the Vsig voltage during the interval were less than the positive voltage ok window, then the process terminates in step 224, as shown.

Referring to FIGS. 17a and 19, the operation of the detector in updating the NDAC voltage in accordance with certain negative peak values of the Vsig voltage will be described. In general, the NDAC voltage is updated in response to the negative peaks of Vsig conversely to the manner in which the PDAC voltage is updated in response to the positive peaks of Vsig. Specifically, and as illustrated between times X and X+1 in FIG. 17a, as long as one of the negative peaks of the Vsig voltage during a given interval is within the negative voltage ok window, then the NDAC voltage is not modified. If however, all of the negative peaks of the Vsig voltage during the interval were greater than the negative voltage ok window (i.e., greater than NDAC+ΔV), then the NDAC voltage is incremented by a predetermined amount, such as one bit, at the end of that interval, as illustrated at time X+2. Finally, in the event that any of the negative Vsig peaks is less than the negative voltage ok window (i.e., is less than the NDAC voltage), then the NDAC voltage is decremented to equal that negative peak voltage, as occurs between times X+2 and X+3 in FIG. 17a.

The operation of the detector in updating the NDAC voltage is illustrated in the flow diagram of FIG. 19 which commences at step 230. In step 234, it is determined whether the Vsig voltage is less than the NDAC voltage. In the event that the Vsig voltage is less than the NDAC voltage, then the NDAC voltage is decremented to equal the value of the Vsig voltage. Alternatively, if the Vsig voltage is not less than the NDAC voltage, then step 242 is next performed in which it is determined whether the particular time interval has ended. Steps 234–242 are repeated until an interval has ended, as shown.

At the end of each time interval, it is determined, in step 246, whether all of the negative peaks of the Vsig voltage during the just ending interval were greater than the negative voltage ok window (i.e., greater than NDAC+ΔV). In the event that all of the negative Vsig peaks during the particular interval were greater than the negative voltage ok window, then the NDAC voltage is incremented by a predetermined amount, such as one bit, in step 250 as illustrated at time X+2 in FIG. 17a, following which the process terminates in step 254. Otherwise, the process terminates directly after step 246, as shown.

Referring to FIG. 14, the update controller 120, which is operative to cause the detector to update the PDAC and NDAC voltages as necessary, includes a positive controller portion 122 and a negative controller portion 126. Since the arrangement and operation of the positive and negative controller portions 122 and 126 mirror each other, the circuitry and operation will be described with particular reference to the positive controller portion 122 for simplicity of illustration.

A counter 128 counts transitions of the Vout voltage of a particular polarity, such as each positive going transition, to provide an update time interval clock signal, cnt128. As noted above, in the illustrative embodiment, each update time interval is comprised of 128 transitions of the Vout output voltage. It will be appreciated by those of ordinary skill in the art that the update time interval may be readily varied.

The positive controller portion 122 includes a comparator 132 having a positive input to which the Vsig voltage is applied and a negative input to which the PDAC−ΔV voltage is applied. Thus, the comparator 132 compares the Vsig voltage to the lower boundary of the positive voltage ok window. The output signal of the comparator 132, p_ok, is applied to the reset input of a cross-coupled NOR latch 150. The output signal of the NOR latch 150, upd_pdac, is applied to the input of a flip-flop 152 which is clocked by the cnt128 signal and which provides an output signal, dcrp. The dcrp signal is applied to the input of a further flip-flop 156 which is clocked by clkn, an inverted version of the system clock signal. The Q output of flip-flop 156 provides the p_cnt_up_n signal to the NOR gate 108 (FIG. 13) and to an input of a NOR gate 154. The Qbar output of flip-flop 156 provides the p_cnt_up signal which is applied to the UPDN input of the counter 114 (FIG. 13) to control the count direction. Flip-flop 152 is reset by the NOR gate 154 at detector start up and each time the counter 114 counts down.

The negative controller portion 126 includes a comparator 138 which compares the Vsig voltage to the upper boundary of the negative voltage ok window, or NDAC+ΔV. The output signal of the comparator 138, n_ok, is coupled to the reset input of a NOR latch 176, which is set at the end of each update time interval by the cnt128 signal. The Q output of latch 176 is a signal, upd_ndac, which is applied to a flip-flop 178. Flip-flop 178 is clocked by the cnt128 signal, as shown, and provides a dcrn output signal to a further flip-flop 182 which is clocked by the clkn signal. The Q output of flip-flop 182 provides the n_cnt_up_n signal to NOR gate 112 (FIG. 13) and further to an input of a NOR gate 180. The flip-flop 182 is reset by the NOR gate 180 at detector start up and when the counter 130 counts down. The Qbar output of flip-flop 182 provides the n_cnt_up signal to the UPDN input of counter 130 (FIG. 13) to control the count direction.

The latch 150 is set by the cnt128 signal at the end of each update time interval. Further, at the end of an update time interval in which the latch 150 has not been reset, the dcrp signal goes high (i.e., the decrement bit is set). Upon the next clock cycle following the decrement bit being set, the p_cnt_up_n signal goes high for a single clock cycle and the p_cnt_up signal goes low for a single clock cycle. A low pulse on the p_cnt_up signal of a one clock cycle duration commands the counter 114 to count down one bit. Recall however, that the counter 114 is only able to count, either up or down, if its HOLD input signal is low.

Figure 20:
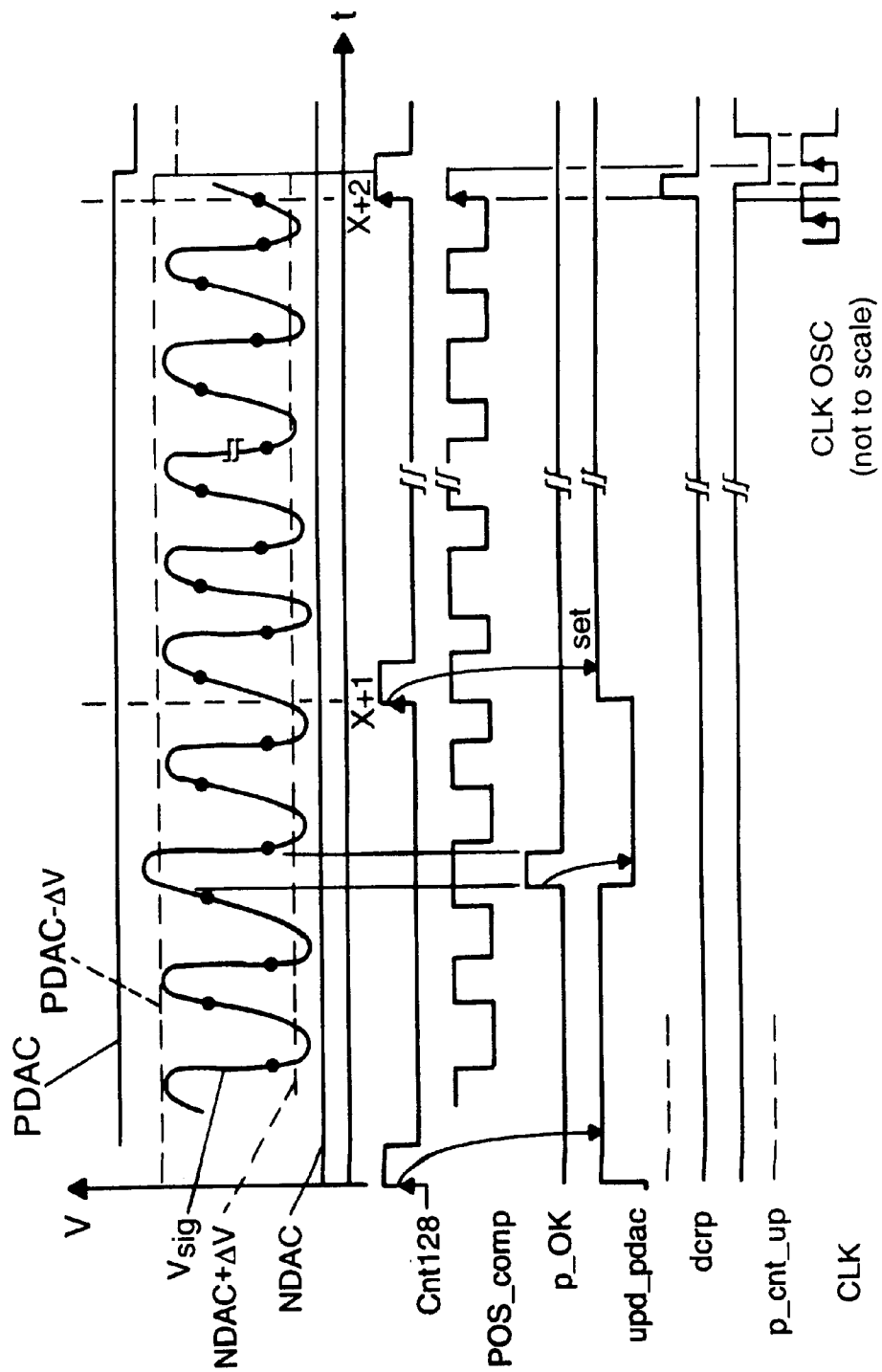
FIG. 20 shows a waveform of Vsig during two update time intervals, with the PDAC, PDAC−ΔV, NDAC and NDAC+ΔV voltages superimposed thereon.

Referring also to FIGS. 20–20g, the operation of the update controller 120 will be illustrated by an example. Specifically, FIG. 20 shows two illustrative update time intervals of the Vsig voltage, with the PDAC voltage, the PDAC−ΔV voltage, the NDAC voltage and the NDAC+ΔV voltage superimposed thereon. FIG. 20a illustrates the cnt128 output signal of the counter 128 (FIG. 14), FIG. 20b illustrates the detector output signal Vout and FIG. 20c illustrates the p_ok output signal of comparator 132 (FIG. 14), during the same time intervals shown in FIG. 20. FIG. 20d shows the upd_pdac output signal of the NOR latch 150, FIG. 20e illustrates the dcrp output signal of flip-flop 152, FIG. 20f illustrates the p_cnt_up output signal of the flip-flop 156 and the clk signal is shown in FIG. 20g, during the same time intervals shown in FIG. 20.

Consider, for example the interval between times X+1 and X+2, in which all of the positive Vsig peaks are less than the lower boundary of the positive voltage ok window, PDAC−ΔV. In this case, the p_ok voltage remains low, so the latch 150 is not reset during this interval. Thus, at the end of the interval, the p_cnt_up signal goes low for a single clock cycle to command the counter 114 to count down by one bit. Further, the counter 114 is enabled under this condition, since the p_cnt_up_n input signal to NOR gate 108 is high and thus, the HOLD input to counter 114 is low.

In the case where at least one positive Vsig peak during an interval is within the positive voltage ok window, as illustrated between times X and X+1 in FIGS. 20–20g, the PDAC voltage is not modified. Under this condition, the p_ok signal goes high to reset the upd_pdac voltage, thereby preventing the decrement bit, dcrp, from being set. Thus, at the end of this interval, the p_cnt_up signal remains high to command the counter 114 to count up. However, the PDAC voltage is not modified since the counter 114 is disabled. More particularly, the HOLD input to the counter 114 is high since both the output of the comparator 100 and the p_cnt_up_n signal are low.

Finally, when a positive Vsig peak exceeds the PDAC voltage, the PDAC voltage is updated to follow, or track the Vsig positive peak any time during the interval. In this case, the p_ok output signal of comparator 100 goes high to reset the latch 150. More particularly, the latch 150 is reset when Vsig exceeds the PDAC voltage. This condition causes the upd_pdac signal to go low and prevents the decrement bit, dcrp, from being set by flip-flop 152 at the end of the interval. Thus, at the end of the interval, the p_cnt_up signal remains high to keep the counter 114 in count up mode. This condition also presents a low to NOR gate 108, allowing the counter 114 to increment as needed any time during the interval by releasing the HOLD signal.

Figure 21:
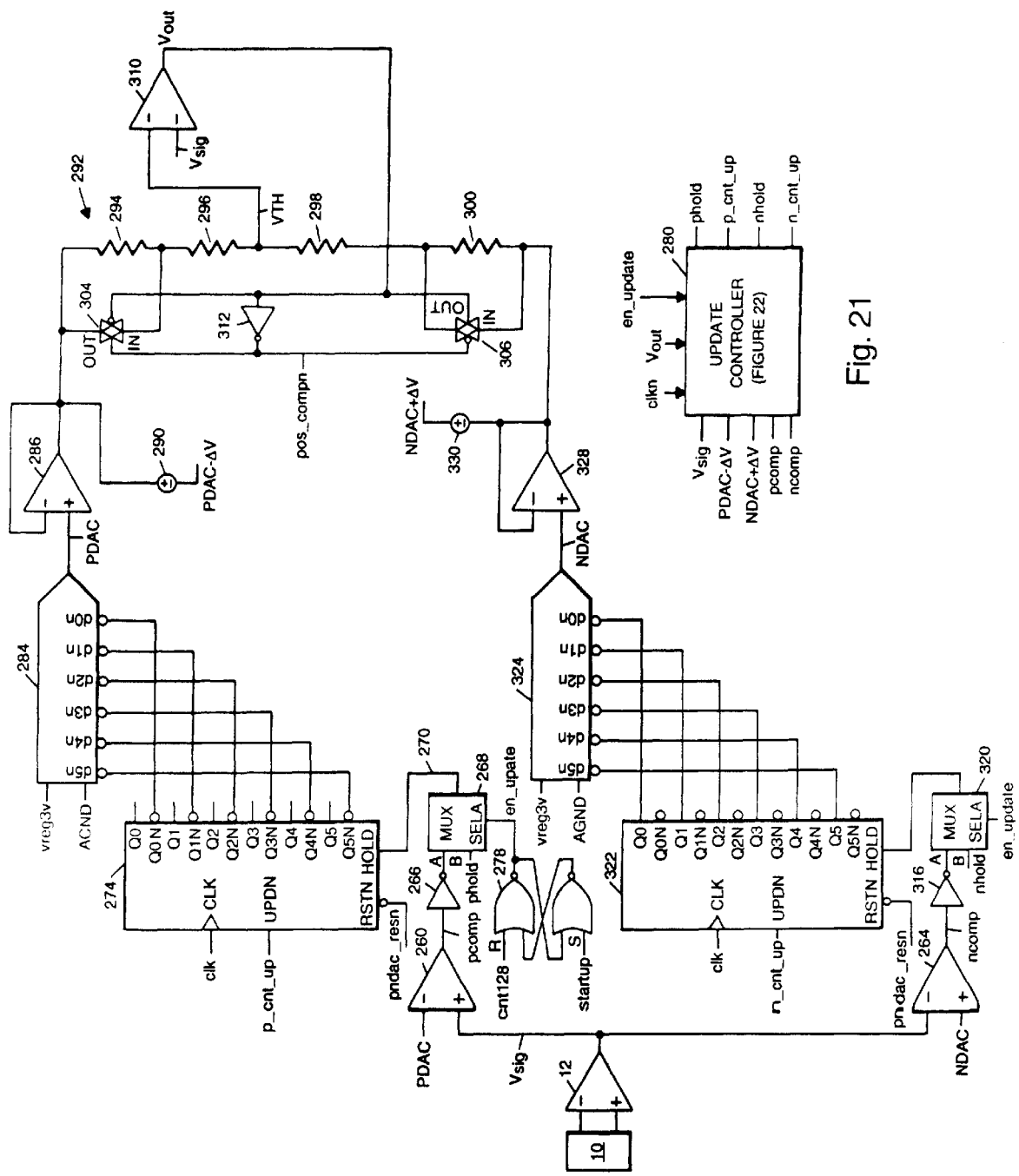
FIG. 21 shows a schematic of a third magnetic-article proximity detector.

Referring also to FIG. 21, an alternate detector embodiment is shown. The detector of FIG. 21 operates in a similar manner to the detector of FIG. 13 to provide an output voltage Vout which is at one binary level when the Vsig voltage exceeds a threshold voltage VTH and is at another binary level when the Vsig voltage is less than the threshold voltage. Further, the detector of FIG. 21 provides the VTH threshold voltage with hysteresis in a like manner to the detector of FIG. 13. The detector of FIG. 21 differs from that of FIG. 13, however, in the manner in which the PDAC and NDAC voltages are updated in accordance with certain variations in the positive and negative peaks of the Vsig voltage, respectively. In general, the detector of FIG. 21 is characterized in that any modifications, or updates to the PDAC and NDAC voltages occur at the end of a particular update time interval and further, in that the PDAC and NDAC voltages are incremented and decremented, respectively, by a predetermined amount. This arrangement is contrasted to varying the PDAC voltage to track a positive peak of Vsig as occurs between times X+2 and X+3 in FIG. 17 or varying the NDAC voltage to track a negative peak of Vsig as occurs between times X+2 and X+3 in FIG. 17a. By incrementing or decrementing the PDAC and NDAC voltages by only a predetermined amount, the occurrence of "hunting" (i.e., the PDAC and NDAC voltages fluctuating to track noise peaks) is reduced.

The detector of FIG. 21 includes the Hall element 10 and the Hall voltage amplifier 12 which provides the amplified Hall voltage, Vsig, as described above. The Vsig voltage is coupled to the positive input of a first comparator 260 and to the negative input of a second comparator 264, as shown. The output signal of the comparator 260, pcomp, is inverted by an inverter 266 for coupling to a multiplexer 268, as shown. The multiplexer 268 is further responsive to a phold control signal provided by an update controller 280 (FIG. 22) for selecting between the output of the inverter 266 and the phold signal for coupling to the multiplexer output. The output signal 270 of the multiplexer 268 provides the HOLD input signal to an up/down counter 274. The select input signal to the multiplexer 268, en_update, is provided by a cross-coupled NOR latch 278, which is set by the startup signal and reset by the cnt128 signal, as shown.

Similarly, the output of the comparator 264 is inverted by an inverter 316, the output of which provides an input to a multiplexer 320. A further input to the multiplexer 320 is provided by an nhold control signal generated by the update controller 280. The multiplexer 320 is responsive to the en_update signal for selecting between the output of the inverter 316 and the nhold signal for coupling to the multiplexer output. The multiplexer output provides the HOLD input signal to an up/down counter 322.

The remainder of the detector of FIG. 21 is substantially identical to the detector of FIG. 13. Specifically, like counter 114 (FIG. 13), the counter 274 is clocked by the CLK signal and reset by the pndac_resn signal. A p_cnt_up signal provided by the update controller 280 controls the direction of the count by the counter 274. The outputs of the counter 274 are coupled to inputs of a PDAC 284, the output of which provides the PDAC voltage. A buffer 286 buffers the PDAC voltage and a voltage source 290 generates the PDAC−ΔV voltage, which is a predetermined voltage, ΔV, less than the PDAC voltage, such as two bits, or 100 mV.

In the "negative portion" of the detector, the counter 322, like counter 130 (FIG. 13), is clocked by the CLK signal and is reset by the pndac_resn signal, as shown. An n_cnt_up signal, provided by the update controller 280, controls the direction in which the counter counts. The outputs of the counter 322 are coupled to inputs of an NDAC 324, the output of which provides the NDAC voltage, as shown. The NDAC voltage is buffered by a buffer 328 which provides a buffered NDAC voltage and a voltage source 330 generates the NDAC+ΔV voltage, which is a predetermined voltage, ΔV, greater than the NDAC voltage, such as two bits, or 100 mV.

A resistor divider 292, including series-coupled resistors 294, 296, 298 and 300, is coupled across the buffered PDAC and NDAC voltages to provide the threshold voltage, VTH as shown. Hysteresis switches 304 and 306 are arranged and operative to provide the VTH threshold voltage with hysteresis in the same manner described above in conjunction with FIG. 13. The VTH threshold voltage is compared to the amplified Hall voltage, Vsig, by a comparator 310, the output of which is the Vout signal. An inverter 312 inverts the Vout voltage to provide a further control input signal to hysteresis switches 304 and 306, as shown.

The logic circuitry which provides the HOLD input signals to the counters 274 and 322 is operative to hold the output of the respective counter constant (i.e., to disable the counter) during each update time interval and at the end of any update time interval during which at least one Vsig peak was within the respective voltage ok window. However, at the end of any update time interval during which a condition requiring updating of the PDAC or NDAC voltage occurred, the logic circuitry is operative to enable the respective counter for a single system clock cycle. In this way, the counter is able to count up or down (depending on the state of the respective p_cnt_up and n_cnt_up signals) by one bit.

Considering the "positive portion" of the HOLD logic circuitry, during the first update time interval following startup of the detector, the en update signal is high to select the A input to multiplexer 268. With the A input selected, the output signal of the multiplexer 268 follows the inverted version of the output of comparator 260. Stated differently, during the first update time interval following detector powerup, the HOLD input signal causes the counter 274 to increment for as long as Vsig is greater than PDAC. Thus, during the first update time interval, the PDAC voltage increases, as necessary, to track the most positive peak of the Vsig voltage.

At the end of the first update time interval, the cnt 128 signal resets the latch 278, causing the en_update signal to go low to select the B input to the multiplexer 268. The B multiplexer input signal is the phold signal provided by the update controller 280. As will become apparent, the phold signal is normally high, causing the counter 274 to be disabled. However, at the end of any update time interval during which a condition requiring updating of the PDAC voltage occurred, the phold signal goes low for a single system clock cycle to enable the counter 274 to count up or down (depending on the logic level of the p_cnt_up signal) by a predetermined amount, such as one bit.

The "negative portion" of the HOLD logic circuitry, including inverter 316 and multiplexer 320, is operative to provide the HOLD input signal to the counter 322 in a manner similar to that of inverter 266 and multiplexer 268. In particular, during the first update time interval, when the en_update select input to the multiplexer 320 is high, the multiplexer 320 selects the A input for coupling to the HOLD input of counter 322. Accordingly, during the first update time interval, the NDAC voltage tracks the most negative peak of the Vsig voltage. At the end of the first update time interval, when the en_update signal goes low, the B input to the multiplexer 320 (i.e., the nhold signal) is selected to provide the HOLD input signal to counter 322. Like the phold signal, the nhold signal is normally high, causing the counter 322 to be disabled. However, at the end of any update time interval during which a condition requiring the NDAC voltage to be updated occurs, the nhold signal goes low for a single system clock cycle to permit the counter 322 to count up or down (depending on the logic level of the n_cnt_up signal) by a predetermined amount, such as one bit.

Before discussing the update controller 280 shown in FIG. 22 and the illustrative way in which the phold, nhold, p_cnt_up and n_cnt_up signals are generated, the manner by which the detector of FIG. 21 updates the PDAC and NDAC voltages in accordance with certain variations in the positive and negative peaks of the Vsig voltage, respectively, will be described in conjunction with FIGS. 23, 23a, 24 and 25. Referring to FIG. 23 and the corresponding flow diagram of FIG. 24, the PDAC updating operation of the detector of FIG. 21 commences at step 400, following which it is determined in step 404 whether the current update time interval is over. Step 404 is repeated until a time interval ends, at which time it is determined in step 408 whether any positive peak of the Vsig voltage during the just ending interval exceeded the PDAC voltage. If any positive peak of Vsig during the interval was greater than the PDAC voltage, then the PDAC voltage is incremented by a predetermined amount, such as one bit, in subsequent step 412, as illustrated at time X+1 in FIG. 23.

In step 416, it is determined whether all the positive peaks of the Vsig voltage during the just ending interval were less than the PDAC−ΔV voltage (i.e., whether all positive peaks of Vsig were less than the positive voltage ok window). In the event that all positive Vsig peaks during the interval were less than the positive voltage ok window, then the PDAC voltage is decremented by a predetermined amount, such as one bit, in subsequent step 420, following which the process terminates in step 424. This condition is illustrated at time X+2 in FIG. 23. Alternatively, the process terminates directly after step 416, as shown.

Figure 23:
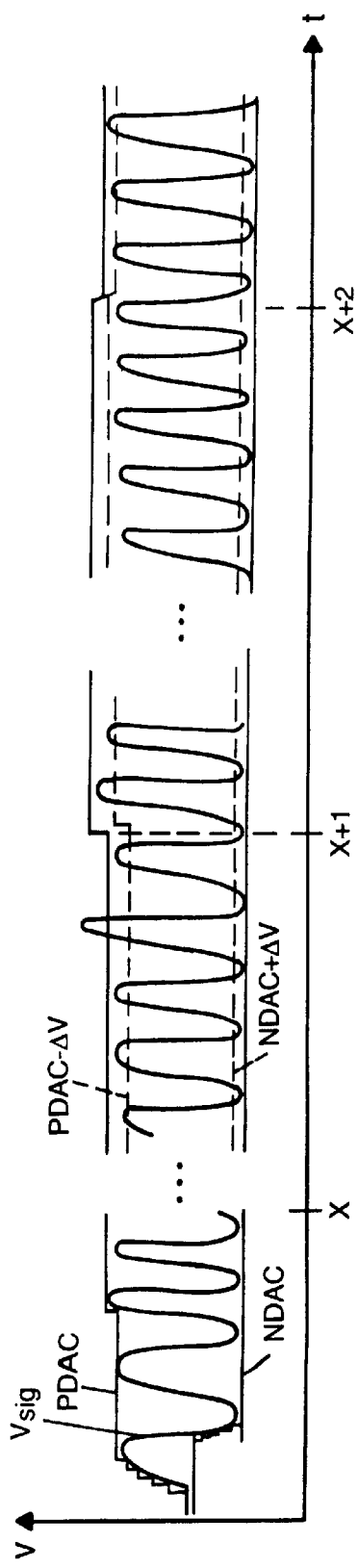
FIG. 23 shows a waveform of Vsig during several update time intervals in which the positive peak values in Vsig are changing. Superimposed on Vsig are the PDAC, PDAC−ΔV, NDAC and NDAC+ΔV voltages generated by the detector of FIG. 21.
Figure 23A:
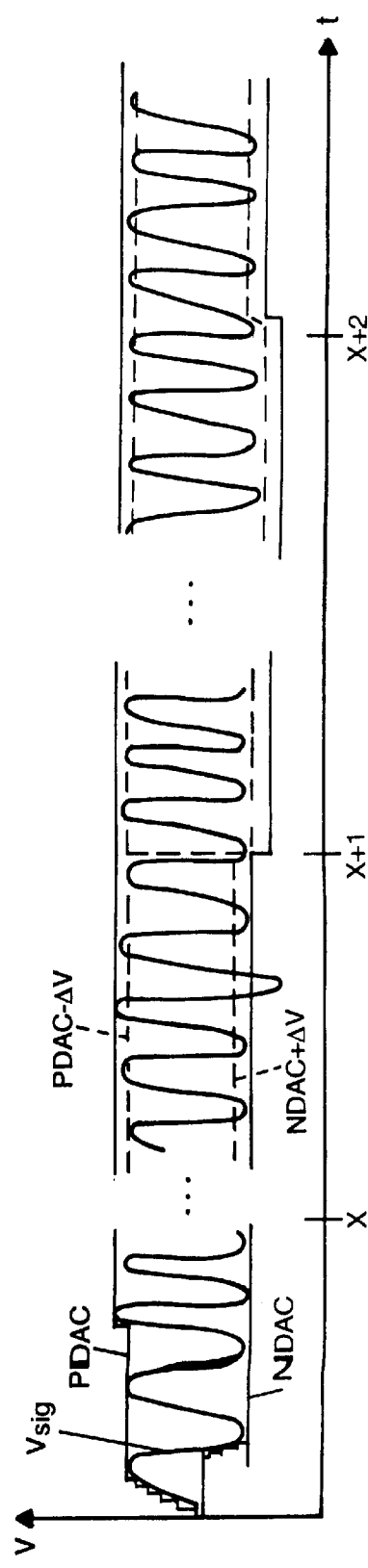
FIG. 23a shows a waveform of Vsig during several update time intervals in which the negative peak values in Vsig are changing. Superimposed on Vsig are the PDAC, PDAC−ΔV, NDAC and NDAC+ΔV voltages generated by the detector of FIG. 21.
Figure 24:
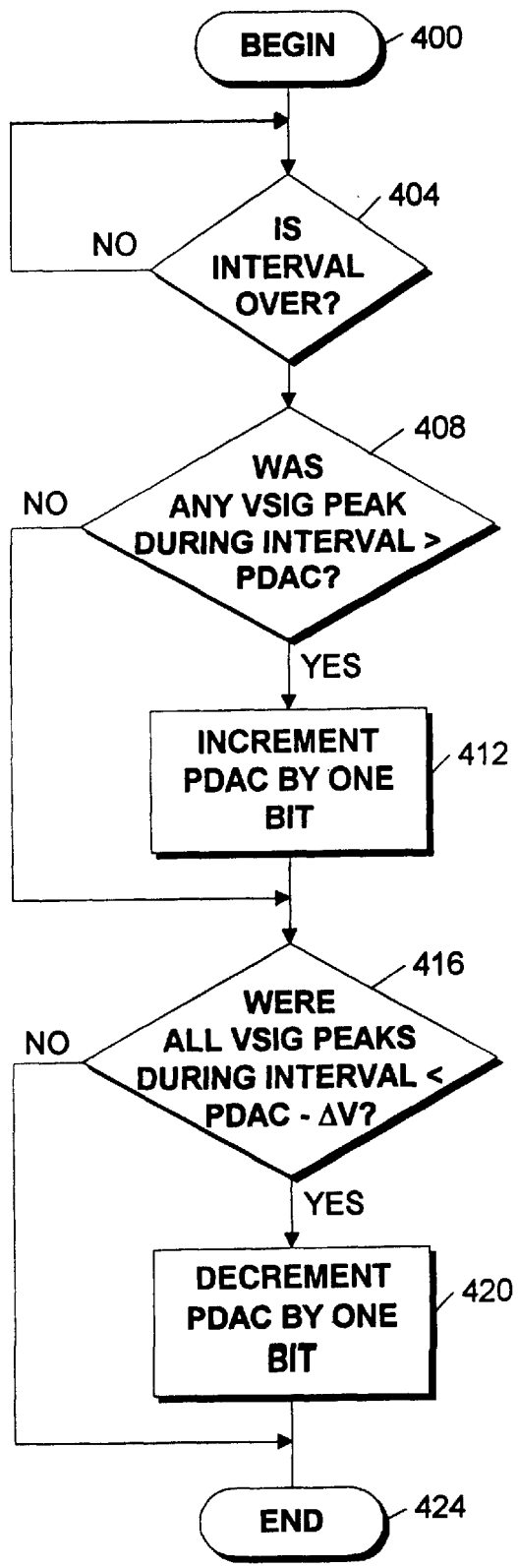
FIG. 24 is a flow diagram illustrating operation of the detector of FIG. 21 in updating the PDAC voltage in accordance with certain changes in the positive peak values of Vsig.
Figure 25:
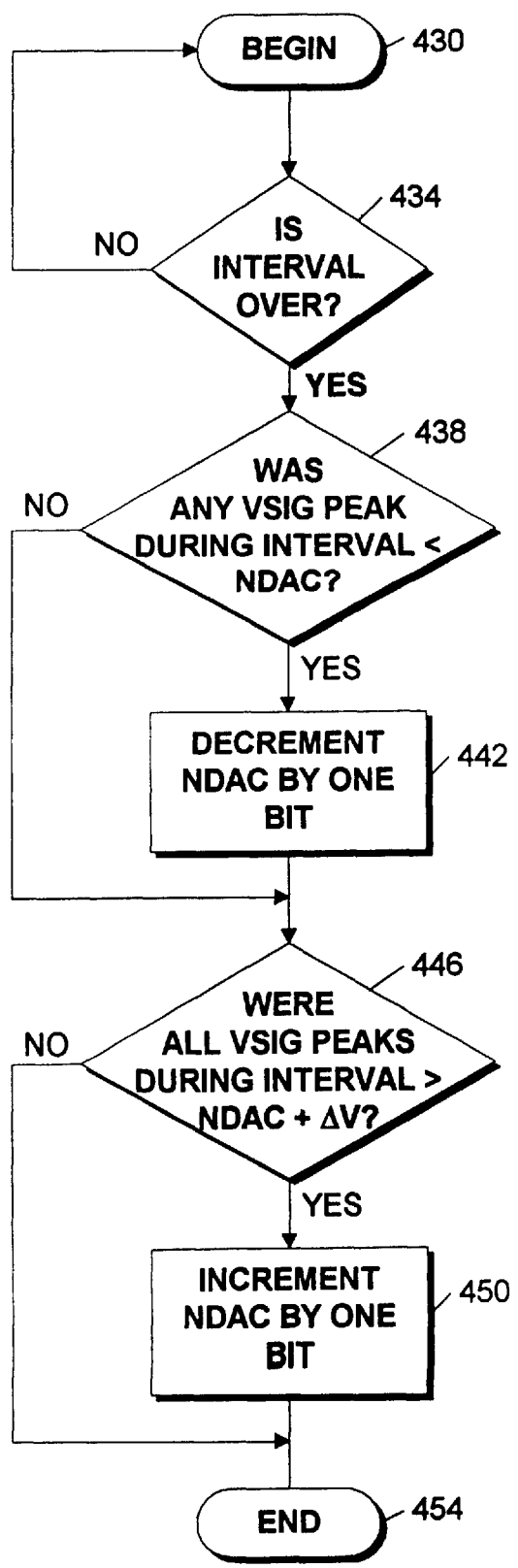
FIG. 25 is a flow diagram illustrating operation of the detector of FIG. 21 in updating the NDAC voltage in accordance with certain changes in the negative peak values of Vsig.

Referring to FIGS. 23a and 25, the operation of the detector of FIG. 21 in updating the NDAC voltage commences at step 430, following which it is determined in step 434 whether the particular update time interval has ended. Once a time interval ends, it is determined in step 438 whether any negative peak of the Vsig voltage during the just ending interval was less than the NDAC voltage (i.e., was less than the negative voltage ok window). In the event that a negative peak of the Vsig voltage was less than the NDAC voltage, then the NDAC voltage is decremented by a predetermined amount, such as one bit, in step 442. This condition is illustrated at time X+1 in FIG. 23a. Alternatively, step 442 is bypassed. Subsequently, in step 446, it is determined whether all of the negative peaks of the Vsig voltage during the just ending interval were greater than the NDAC+ΔV voltage (i.e., whether all negative Vsig peaks were greater than the negative voltage ok window). In the event that all negative Vsig peaks during the interval were greater than the negative voltage ok window, then the NDAC voltage is incremented in step 450 by a predetermined amount, such as one bit, following which the process terminates in step 454. This condition is illustrated at time X+2 in FIG. 23a. Alternatively, the process terminates directly after step 446, as shown.

Figure 22:
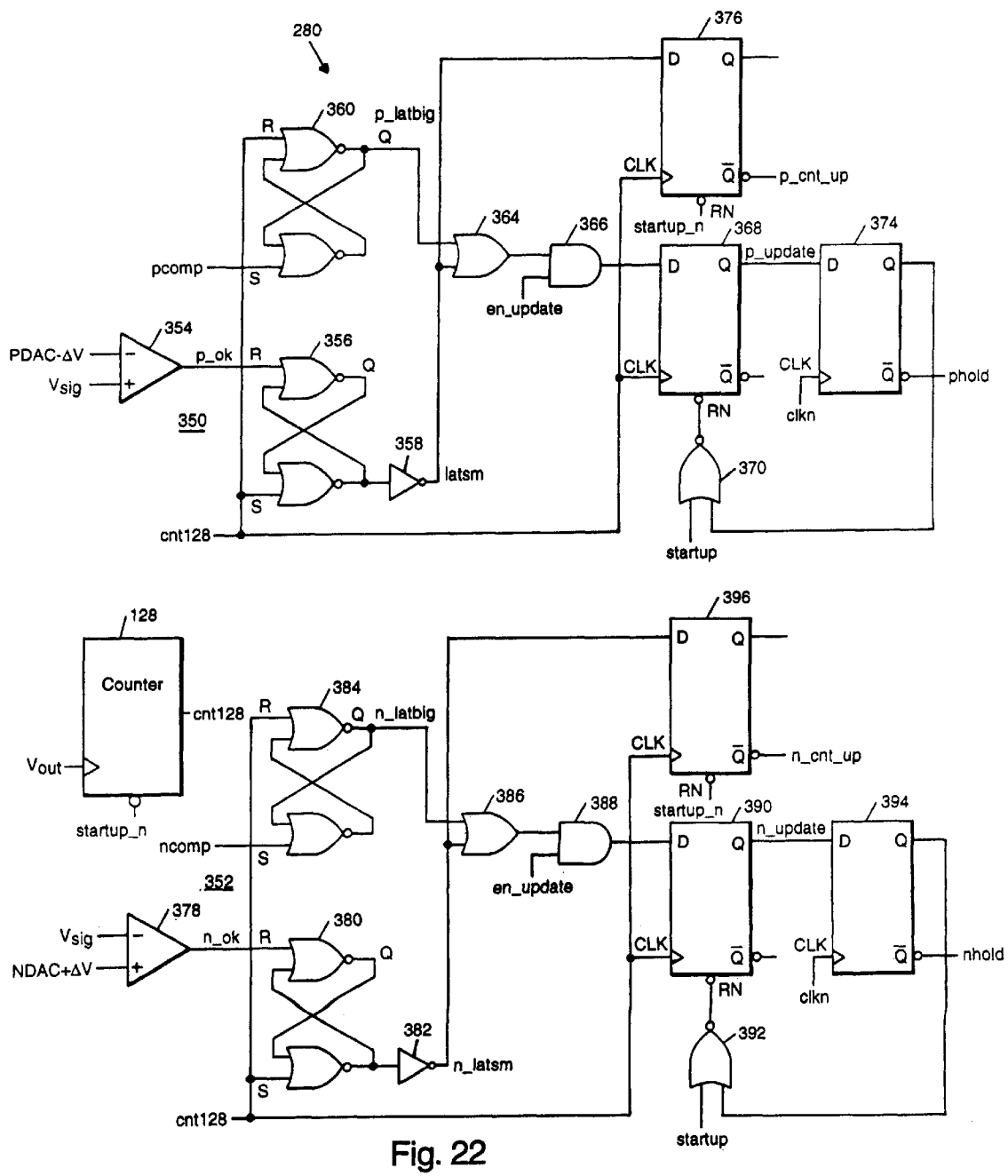
FIG. 22 shows a schematic of the update controller of the proximity detector of FIG. 21.

Referring to the update controller 280 of FIG. 22, like the controller 120 of FIG. 14, the controller 280 includes a positive controller portion 350 and a negative controller portion 352. The update controller 280 will be described with particular reference to the positive controller portion 350 for simplicity. Also shown in the schematic of FIG. 22 is the counter 128 which is responsive to the Vout signal for providing the cnt128 signal, in the manner discussed above in conjunction with FIG. 14.

The positive controller portion 350 includes a comparator 354 for comparing the Vsig voltage to the PDAC−ΔV voltage. The output signal of comparator 354, p_ok, is coupled to the reset input of a cross-coupled NOR latch 356, the set input to which receives the cnt128 signal. The output of latch 356 is inverted by an inverter 358 to provide a p_latsm signal, as shown. The p_latsm signal indicates whether or not the Vsig voltage exceeded the lower boundary of the positive voltage ok window, PDAC−ΔV, during the just ending update time interval.

The comparator 260 (FIG. 21), which compares the Vsig voltage to the PDAC voltage, provides a pcomp signal which is coupled to the update controller 280 and, specifically, to the set input of a cross-coupled NOR latch

360. The NOR latch 360 is reset by the cnt128 signal and provides, at its output, a p_latbig signal, as shown. The p_latbig signal indicates whether or not the Vsig voltage exceeded the upper boundary of the positive voltage ok window, PDAC, during the just ending update time interval.

The p_latsm and p_latbig signals are coupled to respective inputs of an OR gate 364, the output of which is coupled to a first input of an AND gate 366. The second input to AND gate 366 is provided by the en_update signal, as shown. The output signal of AND gate 366 is coupled to the D input of a flip-flop 368, the Q output of which provides a p_update signal. The flip-flop 368 is clocked by the cnt128 signal and is reset by the output of a NOR gate 370, as shown. The p_update signal provides the D input to a further flip-flop 374, the Q output of which is fed back to a first input of the NOR gate 370. The second input to NOR gate 370 receives the startup signal, as shown. The Qbar output of flip-flop 374 provides the phold signal to the B input of multiplexer 268 (FIG. 21).

The p_latsm signal is further coupled to a flip-flop 376, the Qbar output of which provides the p_cnt_up signal to the counter 274 FIG. 21) to control the direction of operation of the counter. The flip-flop 376 is clocked by the cnt128 signal and reset by the startup_n signal, as shown.

As noted above, the negative controller portion 352 is substantially identical to the positive controller portion 350. More particularly, the negative controller portion 352 includes a comparator 378 which compares the Vsig voltage to the upper boundary of the negative voltage ok window, NDAC+ΔV. The n_ok output signal of comparator 378 is coupled to a latch 380, the output of which is inverted by an inverter 382. The comparator 264 (FIG. 21), which compares the Vsig voltage to the NDAC voltage, provides an output signal, ncomp, which is coupled to a latch 384, as shown. The output of latch 384 is an n_latbig signal and the output of inverter 382 is an n_latsm signal both of which are coupled to inputs of an OR gate 386. The n_latsm signal is further coupled to the input of a flip-flop 396. The output of flip-flop 396 provides the n_cnt_up signal which controls the direction of operation of counter 322 (FIG. 21). The output of OR gate 386 is coupled to a first input of an AND gate 388, the second input to which is provided by the en_update signal. The output of AND gate 388 is coupled to a flip-flop 390 which provides an n_update signal to a further flip-flop 394. The Qbar output of flip-flop 394 provides the nhold signal to the multiplexer 320 (FIG. 21). The Q output of flip-flop 394 is fed back to a NOR gate 392 which is further responsive to the startup signal for resetting the flip-flop 390.

Considering operation of the positive controller portion 350, the latch 356 is set at the end of each update time interval and is reset when the Vsig voltage exceeds the PDAC−ΔV voltage. Thus, the p_latsm output signal of inverter 358 transitions to a logic low level during any update time interval in which at least one positive Vsig peak exceeded PDAC−ΔV.

Latch 360 is set when the Vsig voltage exceeds the PDAC voltage and is reset at the end of each update time interval. Thus, the p_latbig signal transitions to a logic high level when the Vsig voltage exceeds the PDAC voltage and remains high until the end of the particular update time interval. Accordingly, the output of OR gate 364 is high if either (1) the Vsig voltage has exceeded the PDAC voltage during the current time interval; or (2) the Vsig voltage has been less than the PDAC−ΔV voltage during the entire current time interval (i.e., if a condition has occurred requiring the PDAC voltage to be updated).

If the output of OR gate 364 is high and the first update time interval following detector startup has passed, then the output of AND gate 366 goes high. Under this condition, at the end of the current update time interval, the flip-flop 368 latches in the high input signal to provide a logic high p_update signal to the flip-flop 374. Further, at the end of the current system clock cycle, the logic high p_update signal is latched into flip-flop 374 to provide a logic low phold signal to the multiplexer 268 (FIG. 21). With the phold signal low, the HOLD input to the counter 274 is likewise low, thereby enabling the counter 274 to count. Further, the phold signal remains low for only a single system clock cycle so that the counter 274 increments or decrements by a predetermined amount, such as one bit.

The direction of operation of counter 274 is determined by the logic level of the p_cnt_up signal. As noted above, the p_cnt_up signal is normally high, causing the counter 274 to count up. However, when the p_latsm signal is low at the end of an update time interval (i.e., if all positive peaks of the Vsig voltage during the just ending interval were less than PDAC−ΔV), then flip-flop 376 causes the p_cnt_up signal to go low, causing the counter 274 to count down. Further, the counter 274 counts down for only a single clock cycle since the phold signal is low or only a single clock cycle.

Figure 26:
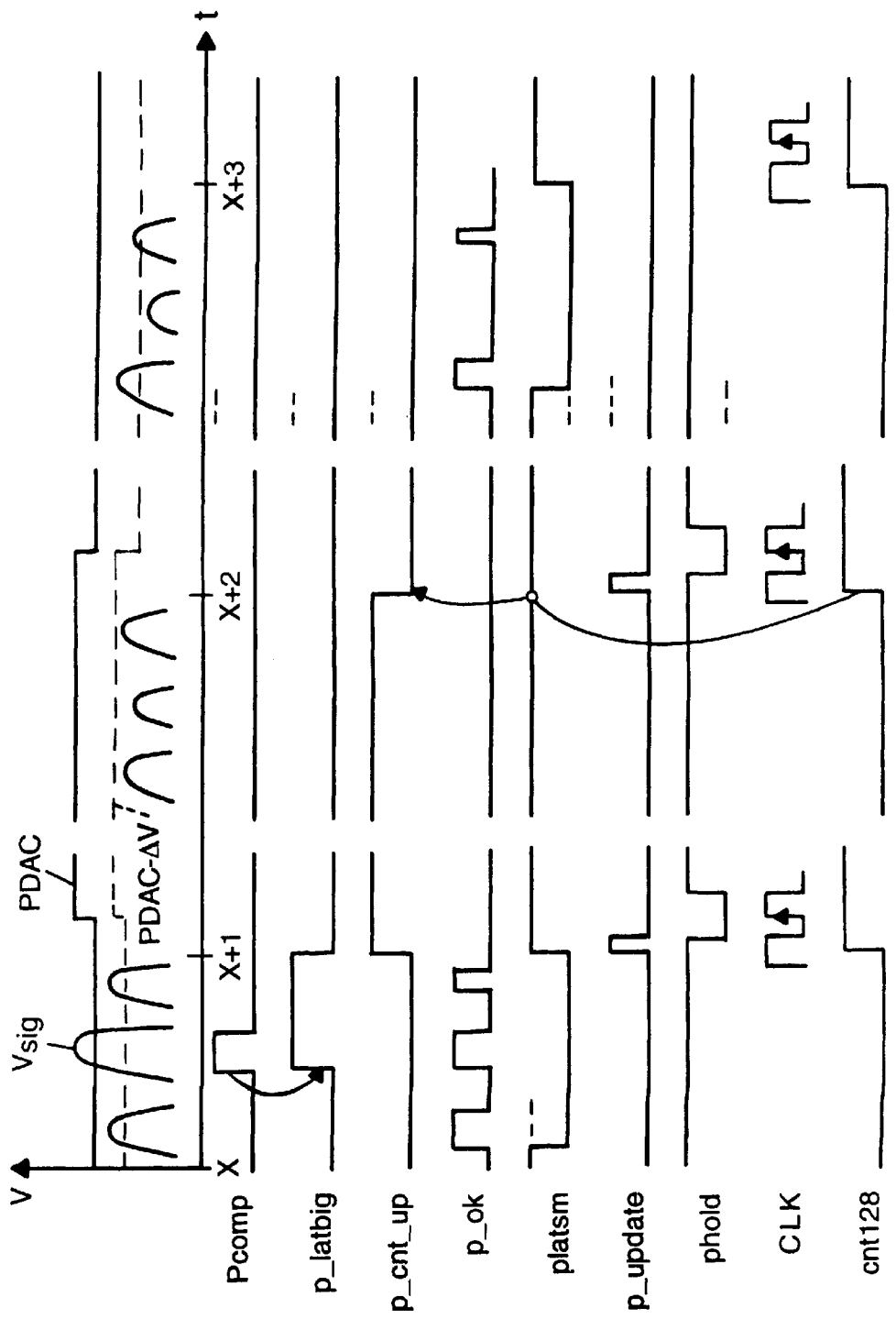
FIG. 26 shows a waveform of Vsig during three update time intervals, with the PDAC and PDAC−ΔV voltages superimposed thereon.

The operation of the positive controller portion 350 will become more apparent by reference to the three illustrative update time intervals of the Vsig voltage in FIG. 26, which shows only the positive peaks of the Vsig voltage for simplicity of illustration. During the interval between times X and X+1, one of the positive peaks of the Vsig voltage exceeds the PDAC voltage. Thus, at the end of the interval, the PDAC voltage is incremented by one bit. To this end, when the Vsig voltage exceeds the PDAC voltage, the pcomp signal goes high and transitions back to a low level when the Vsig voltage decreases to below the PDAC voltage, as shown in FIG. 26*a*. The positive going transition of the pcomp signal causes the latch 360 to be set and the p_latbig signal to go high, as shown in FIG. 26*b*. The p_ok output signal of comparator 354 transitions to a high level every time the Vsig voltage exceeds the PDAC−ΔV voltage and returns to a logic low level when the Vsig voltage falls to below the PDAC−ΔV voltage, as shown in FIG. 26*d*. Thus, the p_latsm signal goes low following the first positive going transition of the p_ok signal during the interval, as shown in FIG. 26*e*.

At the end of the update time interval, at time X+1, the cnt128 signal goes high, which causes flip-flop 368 to latch in the high input signal and the p_update signal to go high. Further, at time X+1, flip-flop 376 latches in the low input signal, causing the p_cnt_up signal to go high and the counter 274 to count up. During the interval ending at time X+1, the D input to latch 368 went high due to the p_latbig signal going high as Vsig exceeded PDAC. Also during this interval, the D input to flip-flop 376 went low due to the p_ok signal resetting latch 356. On the falling edge of the system clock signal CLK following the end of the update time interval, the phold output signal of flip-flop 374 goes low until the next falling edge of the CLK signal. The p_update signal returns to a logic low level when the flip-flop 368 is reset by the phold signal going low. With this arrangement, the counter 274 is enabled by the phold signal to count for a single clock cycle.

During the time interval between times X+1 and X+2, all of the positive peaks of the Vsig voltage are less than the positive voltage ok window, or PDAC−ΔV. Under this condition, the PDAC voltage is decremented by one bit at the end of the interval. Since the Vsig voltage remains less than PDAC−ΔV, the latch 356 is not reset during this time interval and the p_latsm signal remains high. With p_latsm high, the output of OR gate 364 goes high and, since the time interval is not the first following detector start up, the output of AND gate 366 goes high. At time X+2, the p_update signal goes high and upon the next falling edge of the CLK signal, phold goes low for a single clock cycle. Thus, under this condition, the counter 274 is enabled to count up or down by one bit. In particular, the counter 274 counts down, since the p_cnt_up signal is low due to the p_latsm signal being high, as shown.

Considering finally the interval between times X+2 and X+3, one of the positive Vsig peaks is within the positive voltage ok window during this interval. Thus, the PDAC voltage is not updated at the end of the interval. To this end, once the Vsig voltage exceeds the PDAC−ΔV voltage, the p_ok output signal of comparator 354 goes high and resets the latch 356 causing the p_latsm signal to go low. Since the p_latsm signal is low at the end of the interval, the outputs of OR gate 364 and AND gate 366 are low. Thus, the p_update signal and the phold signal remain low and the counter 274 remains disabled, thereby preventing the PDAC voltage from being updated.

Figure 27:
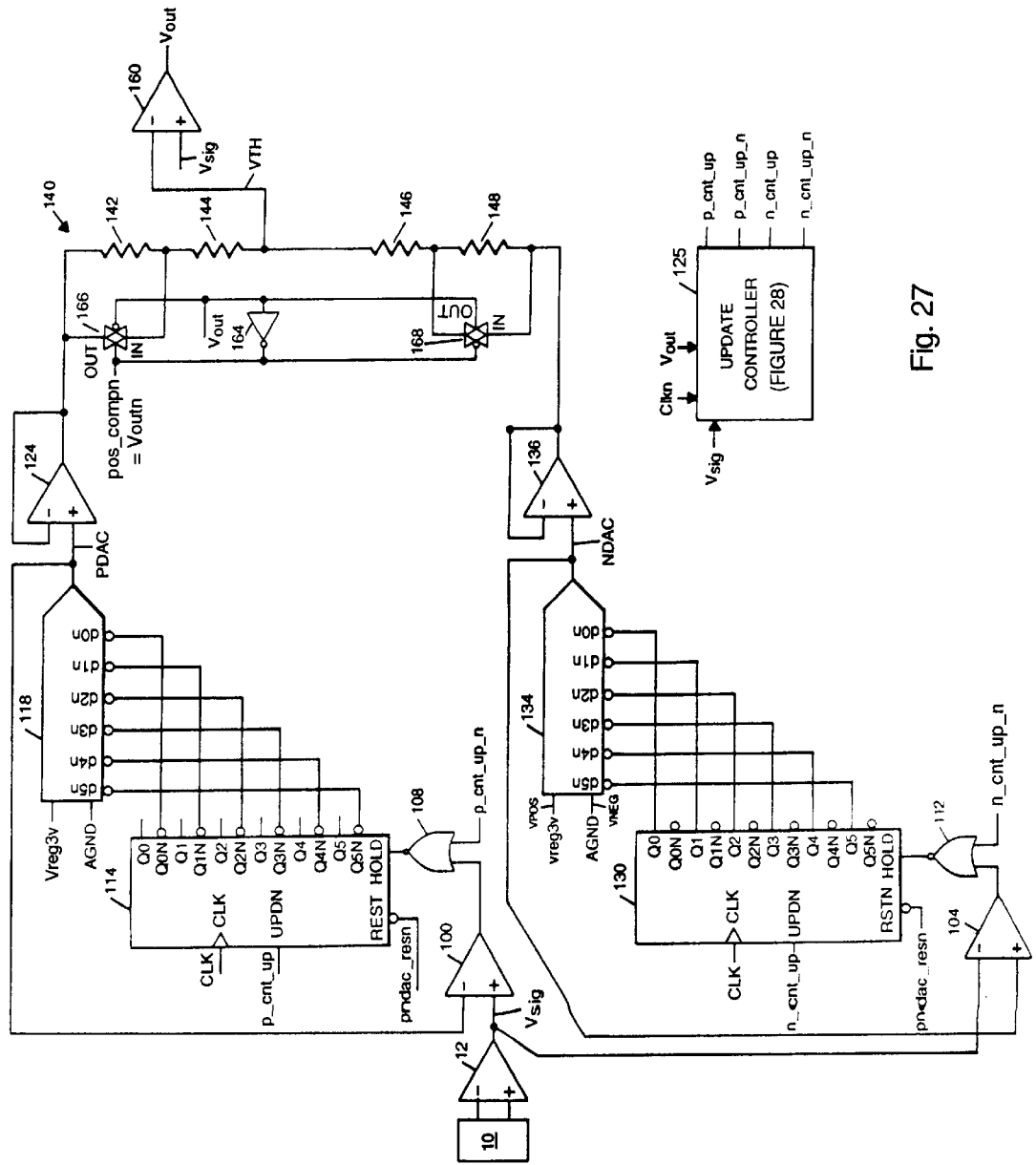
FIG. 27 a schematic of a further magnetic-article detector.

Referring to FIG. 27, a further alternate magnetic field detector is shown. The detector of FIG. 27, like the previously described embodiments, provides an output voltage Vout which is at one binary level when the Vsig voltage exceeds a VTH threshold voltage and is at another binary level when the Vsig voltage is less than the VTH threshold voltage. Further, the detector of FIG. 27 provides the VTH threshold voltage with hysteresis in a like manner to the detectors of FIGS. 13 and 21 in that the VTH threshold voltage is a percentage of the peak-to-peak voltage of Vsig, and is updated to remain the percentage of the peak-to-peak voltage of Vsig, within a predetermined tolerance, even as the peak-to-peak voltage of Vsig varies. In particular, the VTH threshold voltage is at a first level corresponding to a first percentage of the peak-to-peak voltage of Vsig when Vsig exceeds the VTH threshold voltage and is at a second level corresponding to a second percentage of the peak-to-peak voltage of Vsig when Vsig is less than the VTH threshold voltage.

The detector of FIG. 27 differs from those previously described however in the manner in which the PDAC and NDAC voltages are updated. The detector of FIG. 27 updates the PDAC and NDAC voltages by a predetermined amount (e.g., by a predetermined number of bits) after transitions of the Vout voltage and permits the PDAC and NDAC voltages to freely track the positive and negative peaks of the Vsig voltage, respectively. More particularly, the PDAC voltage is decremented by a predetermined amount upon transitions of the Vout voltage of a first polarity and the NDAC voltage is incremented by a predetermined amount upon transitions of the Vout voltage of a second, opposite polarity.

With this arrangement, a relatively simple and robust circuit and technique are provided for updating the PDAC and NDAC voltages to ensure that the VTH threshold voltage remains, within a predetermined tolerance, a percentage of the peak-to-peak Vsig voltage, even as the peak-to-peak Vsig voltage varies. Further advantages of the detector of FIG. 27 include additional hysteresis which serves to reduce the susceptibiltiy of the circuit to noise, but which is introduced at a time when the switch points defining transitions of the Vout voltage are not affected, as will be described below. Additionally, the detector has a relatively fast response time to changes in the peak-to-peak Vsig voltage, since the PDAC and NDAC voltages are updated at each transition of the Vout voltage. In this way, the detector of FIG. 27 provides a Vout signal which accurately reflects changes in the sensed magnetic field and reduces the likelihood that the Vout signal would not switch following significant peak Vsig voltage variations. Further, circuit testing and thus manufacture time and cost is reduced since complicated PDAC and NDAC voltage updating decisions are eliminated by updating the PDAC and NDAC voltage by a predetermined amount after transitions of the Vout signal.

It will be appreciated by those of ordinary skill in the art, and is within the scope of this invention, that the various techniques for updating the PDAC and NDAC voltages described herein may be implemented in the form of, or to include, mid-signal detectors in which the threshold voltage is a fixed percentage of the peak-to-peak Vsig voltage (as is determined by computing a fixed percentage of the voltage PDAC−NDAC) or peak-referenced (i.e., slope-activated) detectors. As one example, the peak-to-peak percentage threshold detectors may include a peak-referenced detector such that the detector output signal Vout becomes one binary level when Vsig rises to exceed a held negative peak excursion (the NDAC voltage) by a predetermined amount and another binary level when Vsig falls to below a held positive peak excursion (the PDAC voltage) by a predetermined amount.

Figure 28:
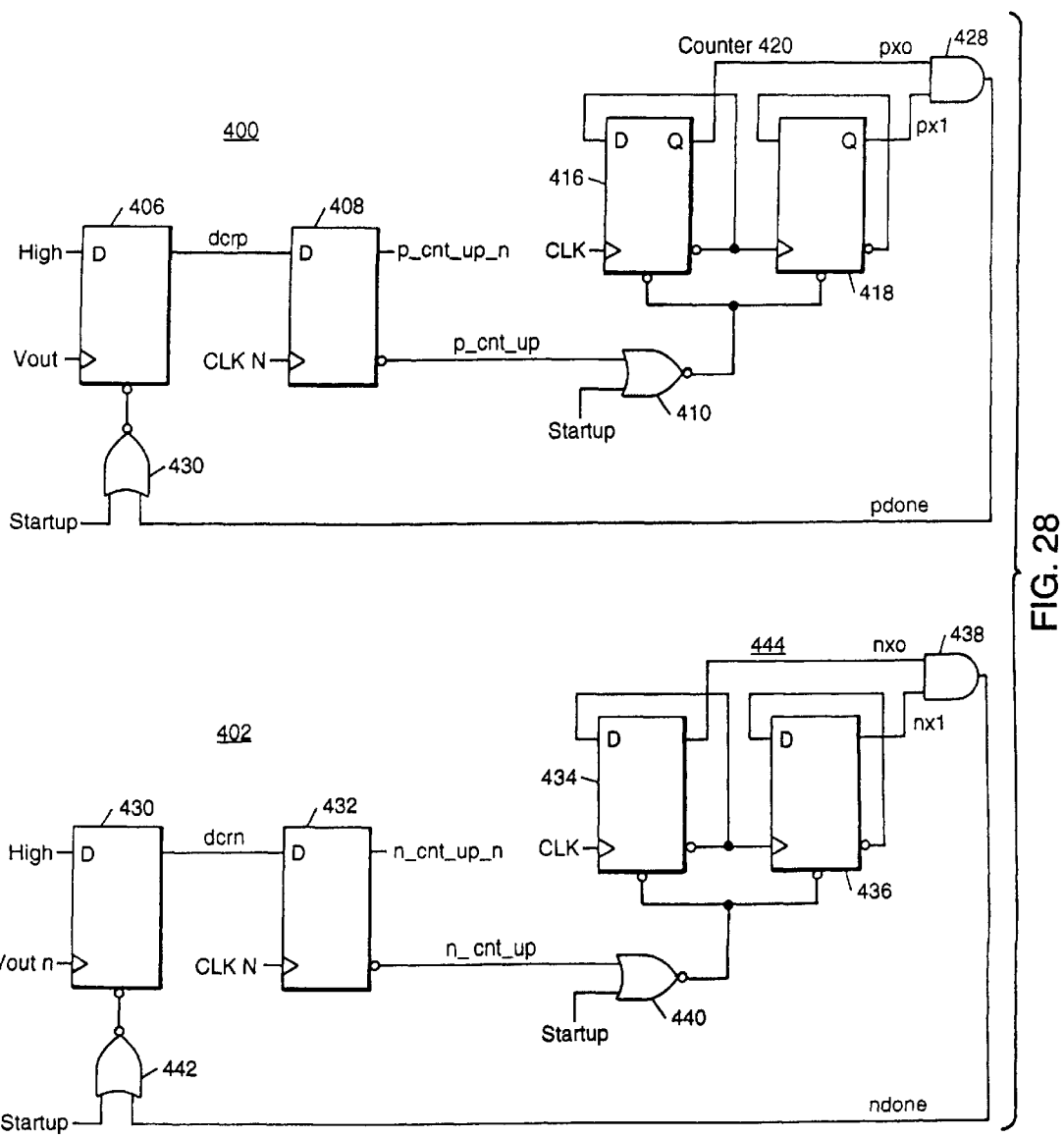
FIG. 28 shows a schematic of the update controller of the detector of FIG. 27.

With the exception of the update controller 125, which is shown and described in conjunction with FIG. 28, the detector of FIG. 27 is substantially identical to the detector of FIG. 13, as is illustrated by the use of like reference numbers for like components. Thus, the counter 114 is a six bit counter which is enabled when the HOLD input (at the output of NOR gate 108) is low. Further the direction of operation of the counter 114 is governed by the p_cnt_up signal. In particular, when the counter 114 is enabled and the p_cnt_up signal is high, the counter 114 counts up and when the counter 114 is enabled and the p_cnt_up signal is low, the counter 114 counts down. Likewise, the counter 130 is enabled when the output of NOR gate 112 is low and is disabled when the output of NOR gate 112 is high. Further, when the counter 130 is enabled and the n_cnt_up signal is high, counter 130 counts up and when the counter 130 is enabled and the n_cnt_up signal is low, the counter 130 counts down.

The outputs of the counter 114 are coupled to inputs of PDAC 118, the outputs of which provide the PDAC voltage which is used to generate the VTH threshold voltage. The PDAC voltage is coupled to a buffer 124 and is fed back to the negative input of comparator 100, as shown. The comparator 100, NOR gate 108, counter 114, PDAC 118 and buffer 124 comprise a "positive portion" of the detector circuitry. A "negative portion" of the detector includes like circuitry similarly arranged. Specifically, the output of the NOR gate 112 is coupled to a HOLD input of counter 130 which is responsive to the CLK clock signal, the pndac_resn_reset signal, and an n_cnt_up control signal provided by the update controller 125 (FIG. 28) which controls the count direction. The outputs of the counter 130 are coupled to inputs of NDAC 134 which provides the NDAC voltage which is used, along with the PDAC voltage, to generate the VTH threshold voltage. The NDAC voltage is coupled to buffer 136 and is further fed back to the negative input of comparator 104, as shown.

The buffered PDAC and NDAC voltages are coupled to resistor divider 140 which generates the VTH threshold voltage for comparison to the Vsig voltage by a comparator 160. The output of comparator 160 provides the detector output signal, Vout, which is at a first binary, or logic level when the Vsig voltage exceeds the VTH threshold voltage and is at a second binary level when the Vsig voltage is less than the VTH threshold voltage. Further, the VTH threshold voltage is provided with hysteresis in the sense that VTH is at a first level corresponding to a first percentage of the peak-to-peak Vsig voltage when Vsig exceeds the VTH threshold voltage and is at a second level corresponding to a second percentage of the peak-to-peak Vsig voltage when Vsig is less than the VTH threshold voltage. That is, once the Vsig voltage falls below the first level of the VTH threshold voltage, the VTH threshold voltage is increased so that the Vsig voltage has to exceed a second, higher level of the VTH threshold voltage before the Vout signal transitions.

Figure 29:
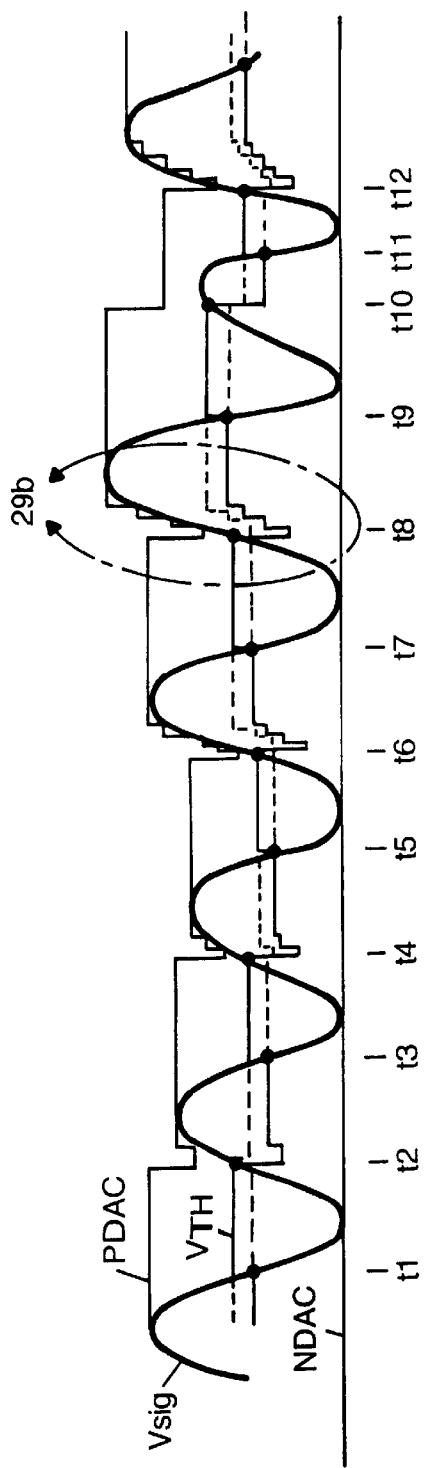
FIG. 29 shows a waveform of Vsig having changing positive peak values, with the PDAC voltage and the VTH threshold voltage superimposed on Vsig.
Figure 29A:
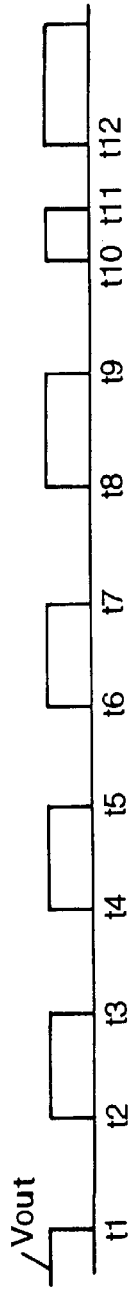
FIG. 29a shows the Vout waveform for the Vsig waveform of FIG. 29.
Figure 29:
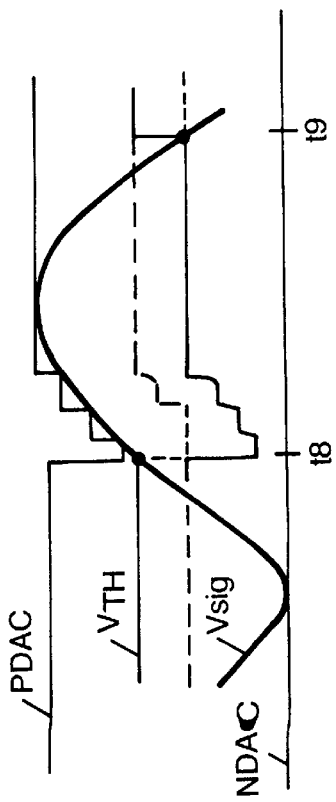
Figure 30:
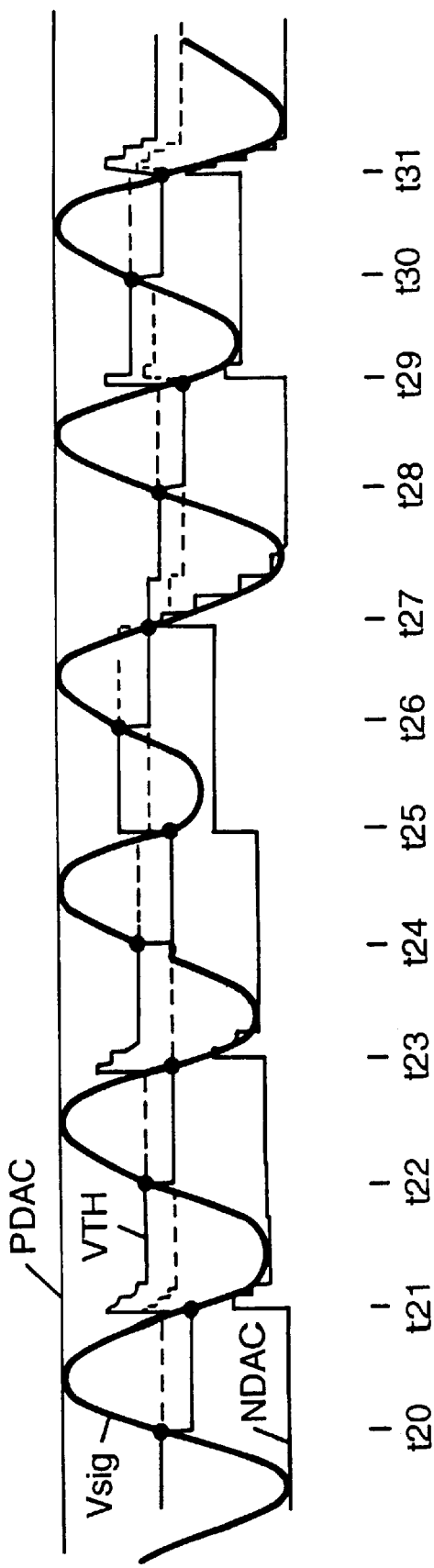
FIG. 30 shows a waveform of Vsig having changing negative peak values with the NDAC voltage and the VTH threshold voltage superimposed on Vsig.
Figure 30A:
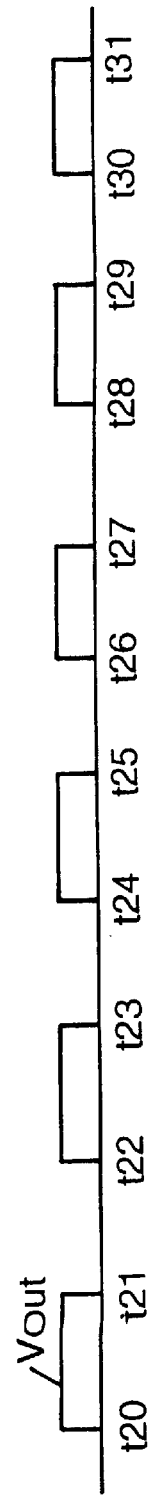
FIG. 30a shows the Vout waveform for the Vsig waveform of FIG. 30.

Before discussing the update controller 125 of FIG. 28, the manner in which the PDAC and NDAC voltages are updated will be described with reference to the waveforms of FIGS. 29, 29a, 29b, 30 and 30a. The illustrative Vsig voltages of FIGS. 29 and 30 are shown with the positive peaks changing and with the negative peaks varying, respectively. It will be appreciated that the positive and negative peaks of Vsig may vary as a result of different factors, such as changes in the airgap between the magnetic article and the detector, a chipped gear tooth in the magnetic article, or a piece of metal being stuck between gear teeth. Further, it will be appreciated that both the positive and negative peaks of the Vsig voltage will vary within a given magnetic article revolution. However, the waveform of FIG. 29 is shown with only the positive peaks varying and the waveform of FIG. 30 is shown with only the negative peaks varying for simplicity of illustration.

The PDAC and NDAC voltages are permitted to freely track the positive and negative peaks of the Vsig voltage, respectively. Further, upon each transition of the Vout signal, the PDAC and NDAC voltages are decremented and incremented, respectively, by a predetermined amount. In particular, the PDAC voltage is decremented by a predetermined amount upon each transition of the Vout signal of a first polarity (e.g., positive-going) and the NDAC voltage is incremented by a predetermined amount upon each transition of the Vout voltage of the second, opposite polarity (e.g., negative-going). In the illustrative embodiment, the PDAC and NDAC voltages are decremented and incremented, respectively, by three bits. However, the predetermined amount can be readily varied and, in general, is selected to approximately equal the largest expected voltage variation between successive Vsig peaks.

Referring to FIG. 29, at time t2, when the Vout voltage transitions to a high level, the PDAC voltage is decremented by three bits. Thereafter, the PDAC voltage tracks the Vsig voltage back up to its next positive peak. The same occurs at times t4, t6, t8, and t12. However, at time t10, when the PDAC voltage is decremented by three bits, the PDAC voltage is greater than the next positive peak of the Vsig voltage (occurring between times t10 and t11) and thus, the PDAC voltage does not track the Vsig voltage again until time t12.

Referring also to FIG. 30, at time t21, when the Vout voltage transitions to a low level, the NDAC voltage is incremented by three bits. Thereafter, the NDAC voltage tracks the Vsig voltage back down to its next negative peak. And the same occurs at times t23, t27, t29 and t31. However, at time t25, when the NDAC voltage is incremented by three bits, the NDAC voltage is less than the next negative peak of the Vsig voltage (occurring between times t25 and t26) and thus, the NDAC voltage does not track the Vsig voltage again until time t27.

Recall that the VTH threshold voltage is generated by a resistor divider network 140 (FIG. 27) coupled between the PDAC and NDAC voltages which includes switches 166, 168 controlled by the Vout and pos_compn control signals such that the VTH threshold voltage is at a first percentage, such as on the order of 40%, of PDAC-NDAC when the Vout voltage is at a first level and is at a second percentage, such as on the order of 60%, of PDAC-NDAC when the Vout voltage is at a second level. In FIGS. 29 and 30, the VTH voltage is shown by a solid line and the other one of the first and second percentages of PDAC-NDAC is shown by a dotted line.

Since the VTH threshold voltage is a function of the PDAC and NDAC voltages, as the PDAC and NDAC voltages are updated, so too is the VTH threshold voltage, as shown. This is best seen in the expanded view of FIG. 29b. At time t8, when the PDAC voltage is decremented, the VTH voltage is decremented too. Thereafter, as the PDAC voltage tracks the Vsig voltage to its next positive peak, the VTH threshold voltage moves up concomitantly.

As is further apparent from consideration of FIG. 29b, the VTH threshold voltage updating scheme implemented with the embodiment of FIGS. 27 and 28 provides additional threshold voltage hysteresis. For example, at time t8, when the VTH threshold voltage changes from the first percentage of PDAC-NDAC to the second, lower percentage of PDAC-NDAC, as shown by the solid line, the VTH voltage is pulled even lower, so that the Vsig voltage would have to go even lower to cause the Vout voltage to switch. Significantly however, this additional hysteresis is provided at a time t hat does not affect the switch points of Vout voltage. That is, by the time the Vsig voltage crosses the VTH threshold voltage again at time t9, the PDAC voltage has tracked the next positive peak of the Vsig voltage and the additional hysteresis no longer affects the VTH voltage. This is particularly advantageous in systems in which the switch points are required to be close to each other, but noise on the Vsig signal makes it desirable for the switch points to be far apart in order to avoid switching as a result of the noise.

Referring also to FIG. 28, the update controller 125 includes a positive portion 400 and a negative portion 402. The positive and negative controller portions are structurally substantially identical, but are responsive to different input signals and provide different output signals. In particular, the positive portion 400 is responsive to the Vout signal and generates the p_cnt_up signal for coupling to the NOR gate 108 and to the counter 114 of FIG. 27 and the p_cnt_up_n signal for coupling to the counter 114. The negative portion 402 is responsive to the inverse of the Vout signal, Voutn, and generates the n_cnt_up signal for coupling to the NOR gate 112 and to the counter 130 of FIG. 27 and the n_cnt_up_n signal for coupling to the counter 130.

The positive portion 400 of the update controller 125 includes a flip-flop 406 clocked by the Vout signal. A dcrp signal is provided at the Q output of the flip-flop 406 and is coupled to the D input to a flip-flop 408. Flip-flop 408 is clocked by the CLKN signal and provides the p_cnt_up signal at its Qbar output, as shown. The p_cnt_up signal is further coupled to an input of a NOR gate 410, the second input which receives the startup signal. The output of the NOR gate 410 is coupled to a reset input of a pair of flip-flops 416, 418 which are connected to form a ring counter 420. The outputs 422, 424 of the ring counter 420 are coupled to inputs of an AND gate 428. A pdone signal provided at the output of the AND gate 428 is coupled to an input of a NOR gate 430, the output of which resets the flip-flop 406. The negative controller portion 402 includes flip-flops 430, 432, flip-flops 434 and 436 forming ring counter 444, and gates 438, 440, and 442 coupled and arranged in the same manner as like elements of the positive portion 400.

The operation of the update controller 125 will be illustrated by consideration of FIG. 28 in conjunction with the illustrative Vsig waveform of FIG. 31 and the Vout, dcrp, CLK, p_cnt_up, ring counter output and pdone signals of FIGS. 31a–31f. In order to permit the PDAC and NDAC voltages to track the positive and negative peaks of the Vsig voltage, respectively, the update controller 125 enables the counters 114 and 130 at all times except as follows: (1) the counter 114 is disabled when the p_cnt_up signal is high which causes the counter 114 to count up and the PDAC voltage is greater than the Vsig voltage; and (2) the counter 130 is disabled when the n_cnt_up signal is high which causes counter 130 to count up and the NDAC voltage is less than the Vsig voltage. In this way, the PDAC voltage is held at the positive peak of the Vsig voltage and is prevented from exceeding the positive peak of the Vsig voltage and the NDAC voltage is held at the negative peak of the Vsig voltage and is prevented from falling below the negative peak of the Vsig voltage. At all other times, the counters 114 and 130 are enabled.

The PDAC voltage is decremented by a predetermined amount upon each positive-going transition of the Vout voltage and the NDAC voltage is incremented by a predetermined amount upon each negative-going transition of the Vout voltage. To this end, when Vout transitions to a logic high level (and once the startup signal transitions, indicating that a certain time has lapsed since power up), the flip-flop 406 is set and causes the dcrp output signal to go high as shown in FIG. 31b. Upon the next falling edge of the CLK signal (or rising edge of CLKN), flip-flop 408 causes the p_cnt_up signal to go low, as shown in FIG. 31d. In its low state, the p_cnt_up signal commands the counter 114 (FIG. 27) to count down. Further, the counter 114 is enabled since the p_cnt_up_n signal coupled to the NOR gate 108 (FIG. 27) is high. The counter 114 thus counts down once per CLKN edge until the p_cnt_up signal transitions to a high level which this occurs once the ring counter 420 counts to a predetermined value (corresponding to the predetermined amount by which the PDAC voltage is to be decremented).

More particularly, in its low state, the p_cnt_up signal causes the reset inputs to the ring counter flip-flops 416, 418 to be released. Thus, upon each rising edge of the CLK signal, the ring counter 420 increments. Once the ring counter 420 counts to three, the pdone output signal of AND gate 428 goes high, thereby causing the flip-flop 406 to be reset which, in turn, causes the dcrp signal to transition to a low level. Upon the next falling edge of the CLK signal, the p_cnt_up signal transitions to a high level, thereby causing the counter 114 to count up. The rising edge of the p_cnt_up signal further causes the ring counter 420 to be reset and thus, the pdone signal to return to its low level, as shown in FIG. 31f.

Conversely, when Vout transitions to a logic low level, the flip-flop 430 is set and causes the dcrn signal to go high, as shown in FIG. 31g. Upon the next rising edge of CLKN, flip-flop 432 causes the n_cnt_up signal to go low, as shown in FIG. 31i. In its low state, the n_cnt_up signal commands the counter 130 (FIG. 27) to count down. Further, the counter 130 is enabled since the n_cnt_up_n signal coupled to the NOR gate 112 (FIG. 27) is high. The counter 130 thus counts down to increment the NDAC voltage until the n_cnt_up signal transitions to a high level which occurs once the ring counter 444 counts to three.

More particularly, in its low state, the n_cnt_up signal causes the reset inputs to the ring counter flip-flops 434, 436 to be released. Thus, upon each rising edge of the CLK signal, the ring counter 444 increments. Once the ring counter 444 counts to three, the ndone output signal of AND gate 438 goes high, causing the flip-flop 430 to be reset which, in turn, causes the dcrn signal to transition to a low level. Upon the next falling edge of the CLK signal, the n_cnt_up signal transitions to a high level, causing the counter 430 to count up. The rising edge of the n_cnt_up signal further causes the ring counter 444 to be reset and thus, the ndone signal to return to its low level as shown in FIG. 31k.

In certain instances, jitter on the Vsig signal may cause concern about unnecessary and inaccurate Vout switching. This scenario could result if noise on the Vsig signal causes the Vsig signal to bounce above and below the VTH threshold voltage. One way to eliminate this possibility is to slow down the CLK signal. In this way, the relatively high frequency noise will not cause the Vout voltage to switch.

Figure 32:
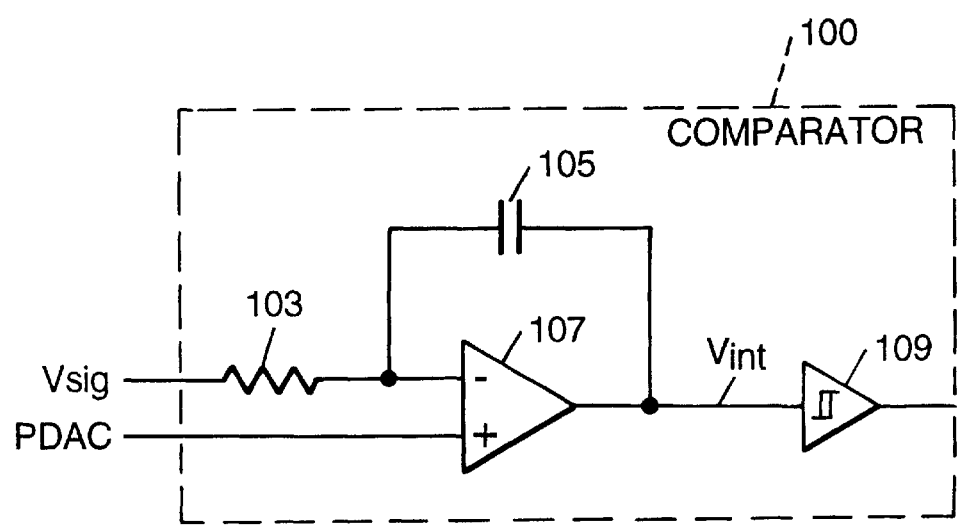
FIG. 32 shows an illustrative comparator of FIG. 27 having an integrator.

Another alternative for eliminating the deleterious effects of relatively high frequency Vsig noise is to add an integrator to the comparators 100 and 104 (FIG. 27). Referring to FIG. 32, illustrative comparator 100 is shown to include an integrator comprising a resistor 103 and a capacitor 105 coupled in feedback relationship with an operational amplifier 107. The output of the operational amplifier 107, Vint, is coupled to a buffer 109 with hysteresis to provide the comparator output signal (which is coupled to an input of NOR gate 108 (FIG. 27)).

Figure 33:
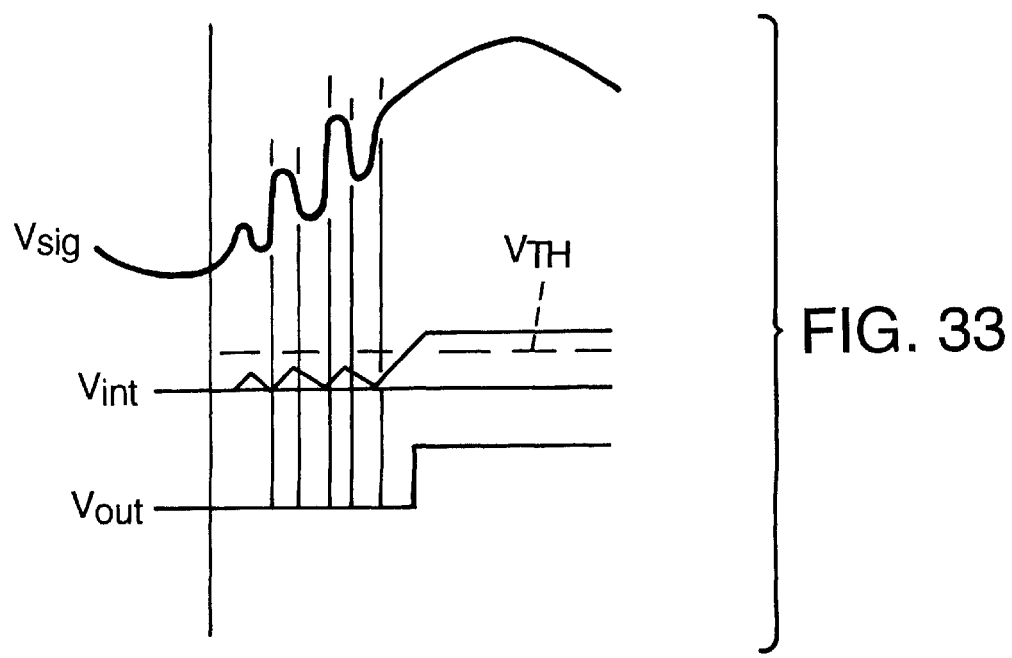
FIG. 33 illustrates the operation of the comparator of FIG. 32 in processing an illustrative noisy Vsig signal.

Referring also to FIG. 33, when a noisy Vsig is processed by the comparator 100 (FIG. 32), the noise is integrated and the Vout voltage does not switch until the Vint voltage exceeds the VTH voltage, as shown. It will be appreciated by those of ordinary skill in the art that the above-presented jitter solutions can be implemented with any of the detector embodiments described herein.

Having described the preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims. All publications and references cited herein are expressly incorporated herein by reference in their entirety.

What is claimed is:

1. A method for detection of passing magnetic articles, comprising the steps of:
   a) sensing an ambient magnetic field and generating a voltage, Vsig, that is proportional to the magnetic field;
   b) generating a threshold voltage that is a percentage of the peak-to-peak voltage of Vsig;
   c) generating a detector output voltage that becomes a first binary level when Vsig rises to exceed the threshold voltage and a second binary level when Vsig falls to below the threshold voltage; and
   d) updating the threshold voltage by a predetermined amount upon each transition of the detector output voltage between the first and second binary levels.

2. The method of claim 1 further comprising the step of updating the threshold voltage to track the positive and negative peaks of the Vsig voltage.

3. The method of claim 1 wherein the threshold voltage generating step comprises:
   a) providing the threshold voltage at a first level that is a first percentage of the peak-to-peak voltage of Vsig when Vsig exceeds the threshold voltage; and
   b) providing the threshold voltage at a second level that is a second percentage of the peak-to-peak voltage of Vsig when Vsig is less than the threshold voltage.

4. The method of claim 3 wherein the threshold voltage generating step comprises:
   a) generating a PDAC voltage as a function of positive peak values of Vsig; and
   b) generating an NDAC voltage as a function of negative peak values of Vsig, wherein the first level of the threshold voltage is the first percentage of the voltage PDAC−NDAC and the second level of the threshold voltage is the second percentage of the voltage PDAC−NDAC.

5. The method of claim 4 wherein the threshold voltage updating step comprises:
   a) decreasing the PDAC voltage by the predetermined amount upon transitions of the detector output signal from the second binary level to the first binary level; and
   b) increasing the NDAC voltage by the predetermined amount upon transitions of the detector output signal from the first binary level to the second binary level.

6. A magnetic article proximity detector comprising:
   a magnetic field sensor providing a voltage output signal, Vsig, proportional to a magnetic field;
   a threshold voltage generator operative to generate a threshold voltage that is a percentage of the peak-to-peak voltage of Vsig; and
   a comparator comparing Vsig to the threshold voltage to generate a detector output voltage that becomes a first binary level when Vsig rises to exceed the threshold voltage and a second binary level when Vsig falls to below the threshold voltage, wherein the threshold voltage is updated by a predetermined amount upon each transition of the detector output voltage.

7. The magnetic article proximity detector of claim 6 wherein said threshold voltage generator comprises:
   a PDAC voltage generator for generating a PDAC voltage as a function of positive peak values of Vsig;
   an NDAC voltage generator for generating a NDAC voltage as a function of negative peak values of Vsig; and
   a circuit coupled between the PDAC voltage and the NDAC voltage for providing the threshold voltage as a percentage of the difference between the PDAC voltage and the NDAC voltage.

8. The magnetic article proximity detector of claim 7 wherein said PDAC voltage generator comprises a first counter having an output at which a first count signal is provided and a first digital to analog converter having an input coupled to the output of the first counter and an output at which said PDAC voltage is provided, wherein said first counter counts in a first direction causing said PDAC voltage to increase when said Vsig voltage is greater than said PDAC voltage.

9. The magnetic article proximity detector of claim 8 wherein said first counter counts in a second, opposite direction for a predetermined duration upon transitions of said detector output voltage from said second binary level to said first binary level.

10. The magnetic article proximity detector of claim 7 wherein said NDAC voltage generator comprises a second counter having an output at which a second count signal is provided and a second digital to analog converter having an input coupled to the output of the second counter and an output at which said NDAC voltage is provided, wherein said second counter counts in a first direction causing said NDAC voltage to decrease when said Vsig voltage is less than said NDAC voltage.

11. The magnetic article proximity detector of claim 10 wherein said second counter counts in a second, opposite direction for a predetermined duration upon transitions of said detector output voltage from said first binary level to said second binary level.

12. A method of detecting passing magnetic articles, comprising the steps of:
   a) sensing an ambient magnetic field and generating a voltage, Vsig, that is proportional to the magnetic field;
   c) generating a PDAC voltage as a function of positive peak values of Vsig;
   d) generating an NDAC voltage as a function of negative peak values of Vsig;
   e) generating a threshold voltage as a percentage of the difference between the PDAC and NDAC voltages;
   f) generating a detector output voltage that becomes a first binary level when Vsig rises to exceed the threshold voltage and a second binary level when Vsig falls to below the threshold voltage;
   g) updating the PDAC voltage by a predetermined amount upon transitions of the detector output voltage from the second binary level to the first binary level; and
   h) updating the NDAC voltage by the predetermined amount upon transitions of the detector output voltage from the first binary level to the second binary level.

13. The method of claim 12 wherein the threshold voltage generating step comprises:
   a) providing the threshold voltage at a first level that is a first percentage of the peak-to-peak voltage of Vsig when Vsig exceeds the threshold voltage; and
   b) providing the threshold voltage at a second level that is a second percentage of the peak-to-peak voltage of Vsig when Vsig is less than the threshold voltage.

14. The method of claim 12 wherein the PDAC voltage updating step includes decrementing the PDAC voltage by the predetermined amount upon positive-going transitions of the detector output voltage.

15. The method of claim 12 wherein the NDAC voltage updating step includes incrementing the NDAC voltage by the predetermined amount upon negative-going transitions of the detector output voltage.

* * * * *

UNITED STATES PATENT AND TRADEMARK OFFICE
CERTIFICATE OF CORRECTION

PATENT NO.   : 6,242,908 B1  
DATED        : June 5, 2001  
INVENTOR(S)  : P. Karl Scheller et al.

It is certified that error appears in the above-identified patent and that said Letters Patent is hereby corrected as shown below:

<u>Column 28,</u>  
Line 26, delete "c)" and replace with -- b) --.  
Line 28, delete "d)" and replace with -- c) --.  
Line 30, delete "e)" and replace with -- d) --.  
Line 32, delete "f)" and replace with -- e) --.  
Line 36, delete "g)" and replace with -- f) --.  
Line 39, delete "h)" and replace with -- g) --.

Signed and Sealed this

Twentieth Day of May, 2003

JAMES E. ROGAN  
*Director of the United States Patent and Trademark Office*